(12) United States Patent
Maeda et al.

(10) Patent No.: US 8,390,106 B2
(45) Date of Patent: Mar. 5, 2013

(54) CIRCUIT BOARD WITH BUILT-IN SEMICONDUCTOR CHIP AND METHOD OF MANUFACTURING THE SAME

(75) Inventors: Yukihiro Maeda, Kasugai (JP); Kouji Kondoh, Toyohashi (JP); Yoshiharu Harada, Okazaki (JP); Takeshi Yamauchi, Nagoya (JP); Tetsuo Fujii, Toyohashi (JP)

(73) Assignee: Denso Corporation, Kariya (JP)

( * ) Notice: Subject to any disclaimer, the term of this patent is extended or adjusted under 35 U.S.C. 154(b) by 59 days.

(21) Appl. No.: 13/076,525

(22) Filed: Mar. 31, 2011

(65) Prior Publication Data

US 2011/0266666 A1    Nov. 3, 2011

(30) Foreign Application Priority Data

Apr. 2, 2010  (JP) .................................. 2010-86344
Jan. 7, 2011  (JP) .................................... 2011-2321

(51) Int. Cl.
*H01L 23/02*    (2006.01)

(52) U.S. Cl. .. 257/678; 257/734; 257/778; 257/E23.141

(58) Field of Classification Search .................. 438/106, 438/125–127; 257/678, 698, 734, 778, 781, 257/784, 786, E21.502, E23.141
See application file for complete search history.

(56) References Cited

U.S. PATENT DOCUMENTS

2008/0017409 A1    1/2008  Takeuchi et al.
2010/0025082 A1    2/2010  Sasaoka et al.

FOREIGN PATENT DOCUMENTS

JP    A-2006-253225    9/2006
JP    A-2009-272435    11/2009

*Primary Examiner* — Leonard Chang
(74) *Attorney, Agent, or Firm* — Posz Law Group, PLC

(57) ABSTRACT

A circuit board includes an insulating member and a semiconductor chip encapsulated with the thermoplastic resin portion of the insulating member. A wiring member is located in the insulating member and electrically connected to first and second electrodes on respective sides of the semiconductor chip. The wiring member includes a pad, an interlayer connection member, and a connection portion. A diffusion layer is located between the first electrode and the connection portion, between the pad and the connection portion, and between the second electrode and the interlayer connection member. At least one element of the interlayer connection member has a melting point lower than a glass-transition point of the thermoplastic resin portion. The connection portion is made of material having a melting point higher than a melting point of the thermoplastic resin portion.

3 Claims, 12 Drawing Sheets

CIRCUIT BOARD WITH BUILT-IN SEMICONDUCTOR CHIP AND METHOD OF MANUFACTURING THE SAME

CROSS REFERENCE TO RELATED APPLICATION

This application is based on and claims priority to Japanese Patent Application No. 2010-86344 filed on Apr. 2, 2010 and No. 2011-2321 filed on Jan. 7, 2011 the contents of which are incorporated herein by reference.

FIELD OF THE INVENTION

The present invention relates to a circuit board including an insulating member with a wiring member and a semiconductor chip built into the insulating member, and also relates to a method of manufacturing the circuit board.

BACKGROUND OF THE INVENTION

JP-A-2009-272435 discloses a circuit board with a built-in semiconductor chip and a method of manufacturing the circuit board.

The semiconductor chip built into the circuit board has via-hole electrodes extending from its front side to its back side. Bumps are formed on the front side of the semiconductor chip, and backside terminals are formed on the back side of the semiconductor chip and connected to the via-hole electrodes. The bumps and the backside terminals are connected to an integrated circuit of the semiconductor chip and serve as electrodes.

The semiconductor chip is mounded in a flip chip manner through the bumps on a core substrate made of glass-reinforced resin. A circuit having connection terminals are formed in the core substrate. The connection terminals of the core substrate are connected to the bumps of the semiconductor chip by ultrasonic bonding. An underfil material is located between the core substrate and the semiconductor chip.

A prepreg layer made of glass-reinforced resin is formed on the core substrate. The prepreg layer has an opening where the semiconductor chip is located.

Wiring layers are formed on the prepreg layer, the semiconductor chip, and the backside of the core substrate. The wiring layer on the prepreg layer and the semiconductor chip is connected to the backside terminals of the semiconductor chip, and the wiring layer on the backside of the core substrate is connected to the circuit of the core substrate.

The circuit board is manufactured by the following method. Firstly, a Si-based semiconductor chip having gold stud pumps on its front side and aluminum terminals on its back side is prepared. The aluminum terminals are connected to via-hole electrodes in the substrate. Further, a core substrate having connection terminals is prepared.

Then, the stud bumps of the semiconductor chip are connected to the connection terminals of the core substrate by ultrasonic bonding. Then, an underfil material is injected between the core substrate and the semiconductor chip and hardened under heat. Further, copper stud bumps are formed on the backside terminals of the semiconductor chip.

Next, a prepreg layer having an opening is stacked on the surface of the core substrate and hardened under pressure and heat. Then, a wiring layer is formed on each side of the core substrate.

US 2008/0017409A corresponding to JP 2007-A-324550 discloses a method of manufacturing a circuit board with a built-in electronic component.

In the method, resin layers including a layer having a conductor pattern on its surface and a layer having a via hole filled with a conductive paste are stacked to form a stacked body in which an electronic component is located.

Then, heat and pressure are applied to the stacked body from its both sides so that thermoplastic resin of the resin layers can be softened. Thus, the resin layers of the stacked body are joined together at a time so that the electronic component can be sealed and encapsulated in the stacked body. At the same time, the conductive paste in the via hole is sintered into an interlayer connection member that serves as an electrode for connecting the conductor patterns.

According to the method disclosed in US 2008/0017409A, the stacked body having the electronic component inside is formed into the circuit board at a time by applying heat and pressure to the stacked body. Therefore, manufacturing process is simplified so that manufacturing time can be reduced.

Recently, in the field of semiconductor chip design, there has been a trend that electrodes are arranged at a fine pitch (i.e., at a narrow pitch) to increase chip integration degree, to increase chip speed, and to reduce chip size. Assuming that a bare semiconductor chip is mounded in a flip chip manner by, the method disclosed in US 2008/0017409A, there is a need to from a via hole having a very small diameter (e. g., several to tens of micrometers) to achieve the fine pitch arrangement and to ensure electrical insulation between adjacent interlayer connection members. It is difficult to form such a small via hole and to fill the small via hole with a conductive paste.

Further, as the via hole is smaller, the amount of the conductive paste in the via hole becomes smaller. As a result, reliability of electrical connection between the interlayer connection member and the conductor pattern may be reduced.

For example, a stud bump is formed on an electrode of the semiconductor chip, and the semiconductor chip is mounded on a substrate by connecting the stud bump on a pad of the substrate. In this case, to prevent adjacent electrodes from being short-circuited, there is a need to connect the stud bump to the pad by solid-phase diffusion bonding as disclosed in JP-A-2009-272435.

Assuming that the above conventional methods are combined to simplify the manufacturing process, stress may be concentrated on the solid-phased stud bump during application of heat and pressure to the stacked body having the semiconductor chip inside. As a result, the semiconductor chip may be damaged by the concentrated stress.

SUMMARY OF THE INVENTION

In view of the above, it is an object of the present invention to provide a circuit board including an insulating member with a wiring member and a semiconductor chip built into the insulating member. It is another object of the present invention to provide a method of manufacturing the circuit board.

According to an aspect of the present invention, a method of manufacturing a circuit board includes a preparing step, a stacking step, and a heat/pressure applying step. In the preparing step, a semiconductor chip and multiple resin layers are prepared. The semiconductor chip has a first electrode on its first side and a second electrode on its second side opposite to the first side. The first electrode has a stud bump. The resin layers include thermoplastic resin layers. The resin layers have a first resin layer, a second resin layer, and a third resin layer. The first resin layer has a conductor pattern with a pad. The second resin layer is made of thermoplastic resin. The third resin layer is made of thermoplastic resin and has a via hole filled with a conductive paste. In the stacking step, the resin layers and the semiconductor chip are stacked to form a stacked body in such a manner that the thermoplastic resin layers are at least alternately arranged. In the heat/pressure applying step, pressure and heat are applied to the stacked body to join the resin layers together at a time into a single insulating member in such a manner that the semiconductor chip is encapsulated in the insulating member to form the circuit board. In the stacking step, the first resin layer is arranged in such a manner that the pad of the first resin layer faces the stud bump of the semiconductor chip through the second resin layer. In the stacking step, the third resin layer is arranged in such a manner that the conductive paste in the via hole of the third resin layer faces the second electrode of the semiconductor chip. In the heat/pressure applying step, the first electrode and the stud bump are bonded together by solid-phase diffusion bonding, and the pad of the first resin layer and the stud bump are bonded together by solid-phase diffusion bonding. Further, in the heat/pressure applying step, the second electrode and the conductive paste of the third resin layer are bonded together by liquid-phase diffusion bonding so that the conductive paste can be sintered.

According to another aspect of the present invention, a circuit board includes an insulating member, a semiconductor chip, and a wiring member. The insulating member has a thermoplastic resin portion. The semiconductor chip has a first electrode on its first side and a second electrode on its second side opposite to the first side. The semiconductor chip is encapsulated with the thermoplastic resin portion. The wiring member is located in the insulating member and electrically connected to the first electrode and the second electrode. The wiring member includes a conductor pattern with a pad, an interlayer connection member in a via hole, and a connection portion for connecting the pad and the first electrode. A first diffusion layer is located at an interface between the first electrode and the connection portion. A second diffusion layer is located at an interface between the pad and the connection portion. A third diffusion layer is located at an interface between the second electrode and the interlayer connection member. At least one element of the interlayer connection member electrically connected to the second electrode has a melting point lower than a glass-transition point of the thermoplastic resin portion. The connection portion is made of material having a melting point higher than a melting point of the thermoplastic resin portion.

BRIEF DESCRIPTION OF THE DRAWINGS

The above and other objectives features and advantages of the present invention will become more apparent from the following detailed description made with check to the accompanying drawings. In the drawings.

DETAILED DESCRIPTION OF THE PREFERRED EMBODIMENTS

Figure 1:
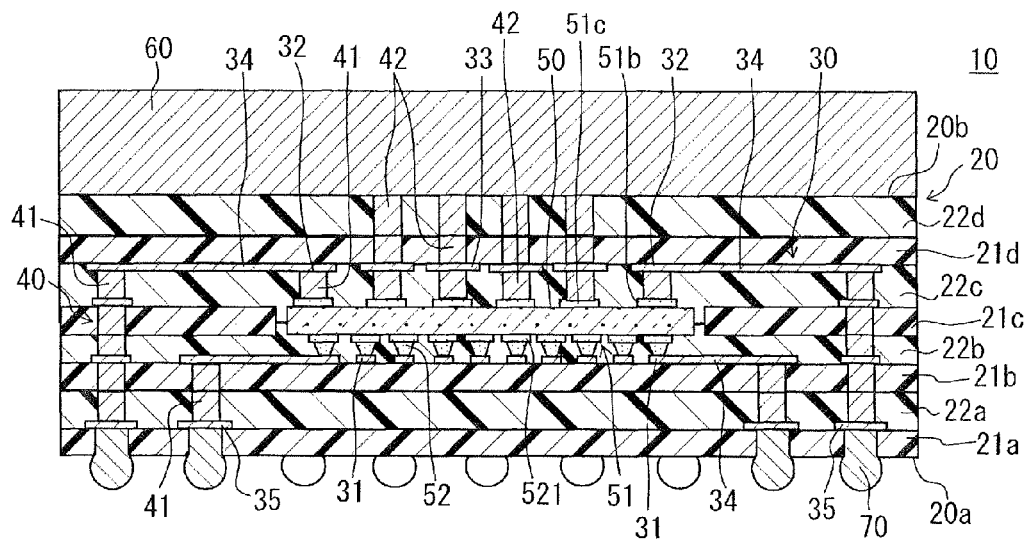
FIG. 1 is a diagram illustrating a circuit board according to a first embodiment of the present invention.

Embodiments of the present invention are described below with reference to the drawings In a method of manufacturing a circuit board according to the embodiments, the following two steps are performed.

1) A step of mounting a semiconductor chip (bare IC chip) having a stud bump in a flip-chip manner on a substrate formed with a first resin layer having a pad through a second resin layer made of thermoplastic resin.

2) A step of encapsulating the substrate, on which the semiconductor chip is mounted, by a patterned prepreg lay-up process (PALAP), which is developed by DENSO Corporation. PALAP is a registered trademark of DENSO Corporation.

A main feature of the present invention is a state of connection between the stud bump and the pad in the steps.

First Embodiment

A circuit board 10 according to a first embodiment of the present invention is described below with reference to FIG. 1. The circuit board 10 includes an insulating member 20, a conductor pattern 30, an interlayer connection member 40, a semiconductor chip 50, and a heat sink 60. The conductor pattern 30 and the interlayer connection member 40 are provided in the insulating member 20. The semiconductor chip 50 is buried into the insulating member 20 so that the semiconductor chip 50 can be built in the insulating member 20.

The insulating member 20 is made of an electrically insulating material. In an example shown in FIG. 1, the insulating member 20 supports the conductor pattern 30, the interlayer connection member 40, the semiconductor chip 50, and the heat sink 60 so that they can be positioned in place. Further, the insulating member 20 holds the semiconductor chip 50 inside so that the semiconductor chip 50 can be protected.

The insulating member 20 is manly made of resin containing thermoplastic resin. The insulating member 20 includes resin layers including thermoplastic resins. The resin layers are stacked and joined together into the insulating member 20 under pressure and heat. As described in detail layer, the thermoplastic resins included in the insulating member 20 serve as an adhesive and a sealant.

In the insulating member 20, the thermoplastic resin layers are at least alternately arranged. For example, assuming that the insulating member 20 includes thermosetting resin layers, the resin layers of the insulating member 20 are stacked so that each thermosetting resin layer can be sandwiched between adjacent thermoplastic resin layers. It is noted that the insulating member 20 can be formed with only the thermoplastic resin layers.

As described in detain later, the thermoplastic resin layer can contain no inorganic material such as glass fiber or aramid fiber. Alternatively, the thermoplastic resin layer can contain such an inorganic material. Likewise the thermosetting resin layer can contain no inorganic material such as glass fiber or aramid fiber. Alternatively, the thermosetting resin layer can contain such an inorganic material.

According to the first embodiment, as shown in FIG. 1, the insulating member 20 includes eight resin layers stacked on top of each other. Specifically, the insulating member 20 includes a thermosetting resin layer 21a a thermoplastic resin layer 22a, a thermosetting resin layer 21b, a thermoplastic resin layer 22b, a thermosetting resin layer 21c, a thermoplastic resin layer 22c, a thermosetting resin layer 21d, and a thermoplastic resin layer 22d that are stacked in this order. Thus, in the insulating member 20, a thermosetting resin layer and a thermoplastic resin layer alternate. An outer surface of the thermosetting resin layer 21a defines a first surface 20a of the insulating member 20, and an outer surface of the thermoplastic resin layer 22d defines a second surface 20b of the insulating member 20. A direction from the first surface 20a to the second surface 20b is a thickness direction of the insulating member 20. A direction perpendicular to the thickness direction is a surface direction of the insulating member 20.

For example, each of the thermosetting resin layers 21a-21d can be a thermosetting polyimide (PI) film containing no inorganic material such as glass fiber. Each of the thermoplastic resin layers 22a-22d can be a resin film containing no inorganic material such as glass fiber and no inorganic filler for adjustment of linear expansion coefficient. For example, each of the thermoplastic resin layers 22a-22d can be a resin film containing 30 weight percent of Polyether ether ketone (PEEK) and 70 weight percent of polyether imide (PEI).

The thermosetting resin layer 21b corresponds to a first resin layer (as a substrate) where the semiconductor chip 50 is mounted. The thermoplastic resin layer 22b corresponds to a second resin layer for filling a gap between the thermosetting resin layer 21b and the semiconductor chip 50. The thermoplastic resin layer 22c corresponds to a third resin layer for encapsulating the semiconductor chip 50 along with the thermosetting resin layer 21b.

The conductor pattern 30 is formed by patterning a conductive foil. The conductor pattern 30 serves as an electrical wiring member for electrically connecting the semiconductor chip 50 and external circuitry. Further, the conductor pattern 30 can serve as a thermal wiring member for releasing heat from the semiconductor chip 50 outside the insulating member 20.

The interlayer connection member 40 includes a via hole (through hole) extending through the resin layer in the thickness direction and a conductive paste filling the via hole. Specifically, conductive particles in the conductive paste are sintered under pressure and heat. The interlayer connection member 40 corresponds to a sintered member in claims. The interlayer connection member 40 serves as the electrical wiring member along with the conductor pattern 30. Further, the interlayer connection member 40 can serve as the thermal wiring member along with the conductor pattern 30.

Figure 7:
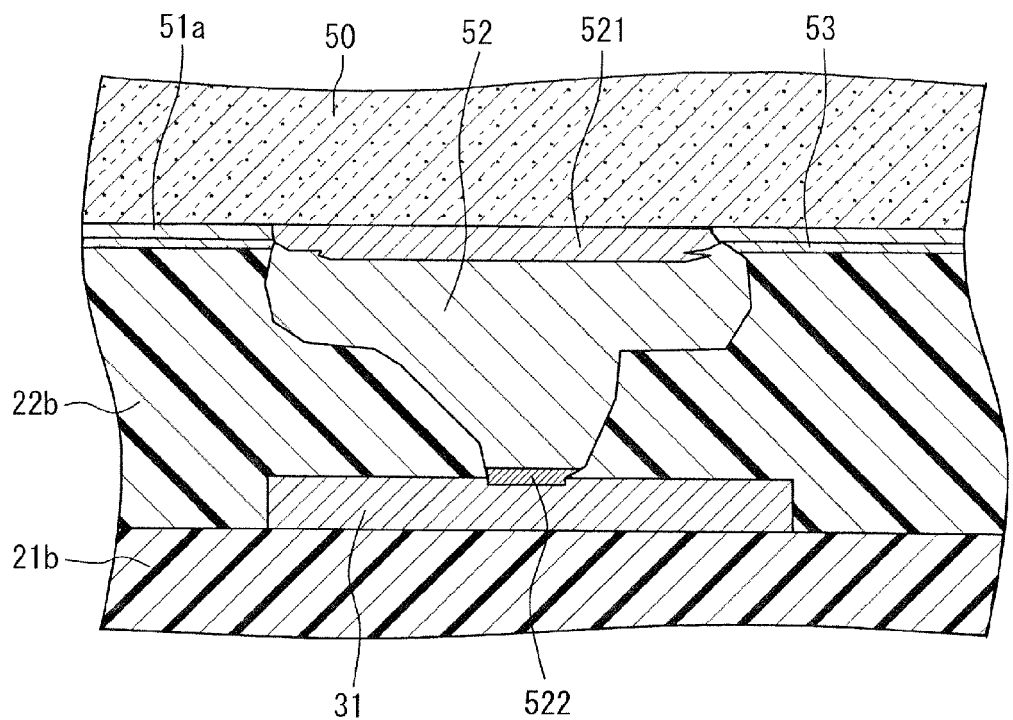
FIG. 7 is a diagram illustrating a partial enlarged view of FIG. 1.

The semiconductor chip 50 has an electrode 51. The electrode 51 includes electrodes 51a, 51b and a dummy electrode 51c. According to the first embodiment, the conductor pattern 30 and the interlayer connection member 40 work in conduction with each other to provide the electrical wiring member for electrically connecting the electrodes 51a, 51b of the semiconductor chip 50 to an external connection electrode 35. Further, another conductor pattern 30 and another interlayer connection member 40 work in conduction with each other to provide the thermal wiring member for thermally connecting the dummy electrode 51c of the semiconductor chip 50 to the heat sink 60. The electrode 51a corresponds to a first electrode in claims and the electrodes 51b, 51c correspond to a second electrode in claims. It is noted that the electrode 51a is not illustrated in FIG. 1. As described in detail later, the electrode 51a is made of aluminum (Al) material before application of pressure and heat. However, after application of pressure and heat, all aluminum of a portion of the electrode 51a facing a connection member 52 of the electrode 51a in the thickness direction becomes AuAl alloy layer 521 mainly containing $Au_4Al$ alloy (see, FIG. 7). That is, the portion of the electrode 51a directly below the connection member 52 in the thickness direction becomes AuAl alloy layer 521. In other words, the portion of the electrode 51a sandwiched between the semiconductor chip 50 and the connection member 52 in the thickness direction becomes AuAl alloy layer 521. It is not necessary that other portion of the electrode 51a becomes AuAl alloy layer 521. In an example shown in FIG. 7, a portion of the electrode 51a covered with an insulating layer 53 such as silicon nitride (SiN) remains aluminum, even after application of pressure and heat.

Specifically, the conductor pattern 30 is formed by patterning a copper (Cu) foil into a predetermined shape. The conductor pattern 30 includes pads 31-33. The pad 31 corresponds to the electrode 51a of the semiconductor chip 50. The pad 32 corresponds to the electrode 51b of the semiconductor chip 50. The pad 33 corresponds to the dummy electrode 51c of the semiconductor chip 50. The conductor pattern 30 further includes a lateral wiring member 34 extending in the surface direction. The external connection electrode 35 for electrically connecting the semiconductor chip 50 to external circuitry is included in the conductor pattern 30.

Figure 4:
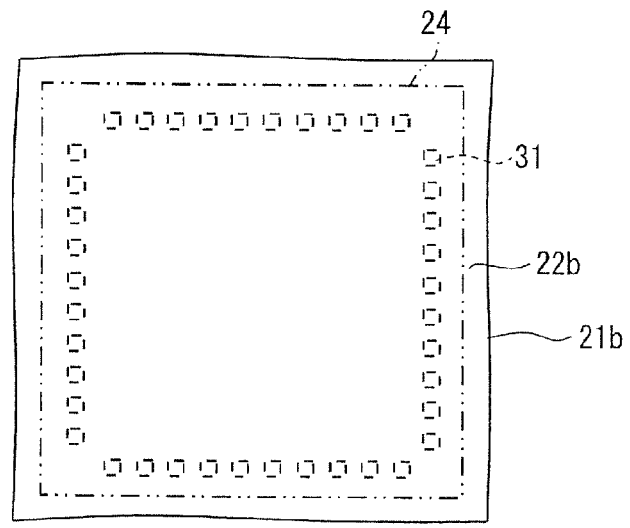
FIG. 4 is a diagram illustrating a top view of FIG. 3B.

The electrodes 51 of the semiconductor chip 50 are arranged at a predetermined pitch. The pads 31-33 are arranged at the same pitch as the corresponding electrodes 51. According to the first embodiment, although not shown in the drawings the electrodes 51a are arranged in a rectangular ring. Each side of the rectangular ring is defined by ten electrodes 51a arranged in line. As shown in FIG. 4, the pads 31 corresponding to the electrodes 51a are arranged in a rectangular ring so that the pads 31 can be arranged at the same pitch as the electrodes 51. As shown in FIG. 1, the pad 31 is connected through the lateral wiring member 34 to the interlayer connection member 40 that is located inside or outside the rectangular ring. The pad 31 and the lateral wiring member 34 are on the same layer.

Further, according to the first embodiment the interlayer connection member 40 is made of Ag—Sn alloy. The interlayer connection member 40 includes a first interlayer connection member 41 and a second interlayer connection member 42. The first interlayer connection member 41 provides a vertical wiring member of the electrical wiring member. The second interlayer connection member 42 thermally connects the dummy electrode 51c to the heat sink 60.

The first interlayer connection member 41, the lateral wiring member 34, and the pads 31, 32 are included in the electrical wiring member. The second interlayer connection member 42 and the pad 33 are included in the thermal wiring member.

A metal diffusion layer is formed at an interface between the conductor pattern 30 made of Cu and the interlayer connection member 40 made of Ag—Sn alloy. Specifically, the metal diffusion layer formed between the conductor pattern 30 and the interlayer connection member 40 is a Cu—Sn alloy layer. The Cu—Sn alloy layer improves reliability of connection between the conductor pattern 30 and the interlayer connection member 40.

The connection member 52 is located on the electrode 51a of the semiconductor chip 50 and made of gold (Au). The connection member 52 is included in the electrical wiring member for electrically connecting the semiconductor chip 50 to the external circuitry. A metal diffusion layer is formed at an interface between the pad 31 and the connection member 52. Specifically, the metal diffusion layer formed between the pad 31 and the connection member 52 is a CuAu alloy layer 522 (preferably, $CuAu_3$ alloy layer). The CuAu alloy layer 522 improves reliability of connection between the pad 31 and the connection member 52.

Further, according to the first embodiment the external connection electrode 35 is formed on an inner surface of the thermosetting resin layers 21a. As mentioned previously, the outer surface of the thermosetting resin layer 21a defines the first surface 20a of the insulating member 20.

The semiconductor chip 50 is a bare IC chip. The semiconductor chip 50 includes a semiconductor substrate and circuit elements integrated in the semiconductor substrate to form an integrated circuit (e.g., large-scale integrated circuit). For example, the semiconductor substrate can be a silicon substrate, and the circuit elements can include a transistor, a diode a resistor, and capacitor. The electrodes 51 are formed on a surface of the semiconductor chip 50. The semiconductor chip 50 is encapsulated (i.e., sealed) in the insulating member 20.

According to the first embodiment, as shown in FIG. 1, the AuAl alloy layer 521 (i.e., electrode 51a) and the electrode 51b are electrically connected to the circuit of the semiconductor chip 50. In contrast, the dummy electrode 51c is electrically disconnected from the circuit of the semiconductor chip 50.

The AuAl alloy layers 521 are formed on a first side of the semiconductor chip 50. The AuAl alloy layer 521 has no elemental aluminum. The AuAl alloy later 521 mainly contains $Au_4Al$ alloy and is formed by solid-phase diffusion between Al of the electrode 51a and Au of the connection member 52. That is, the AuAl alloy layer 521 is formed by alloying the electrode 51a under pressure and heat. Therefore the AuAl alloy layer 521 is connected to the connection member 52. In summary, before application of heat and pressure the AuAl alloy layer 521 is the electrode 51a that is made of aluminum material and has no Au. Then, all Al of the electrode 51a combine with Au of the connection member 52 by solid-phase diffusion of Au into Al so that the AuAl alloy layer 521 having no elemental aluminum can be formed. The connection member 52 can be made of material (i.e., Au) having a melting point higher than a melting point of the thermoplastic resin layer of the insulating member 20. It is noted that the connection member 52 is a stud bump 52a before application of heat and pressure.

If the AuAl alloy layer 521 has elemental aluminum at an interface with the connection member 52 (i.e., if elemental aluminum in the electrode 51a remains at an interface between the semiconductor chip 50 and the stud bump 52a), solid-phase diffusion of Au in the connection member 52 into Al in the electrode 51a occurs in high temperature environment so that $Au_5Al_2$ can be formed. A growing rate of $Au_5Al_2$ is much greater than a growing rate of $Au_4Al$. Therefore, the diffusion of Au is delayed from the formation of $Au_5Al_2$. As a result, Kirkendall void (see, void B1 shown in FIG. 12) is formed between the semiconductor chip 50 and the connection member 52 (e.g. between $Au_5Al_2$ and $Au_4Al$). The Kirkendall void causes a crack.

In contrast, according to the first embodiment, the AuAl alloy layer 521 has no elemental aluminum but has mainly $Au_4Al$ alloy, which is the final product of AuAl alloy. Therefore, even in high temperature environment, the formation of the Kirkendall void can be reduced so that the crack can be reduced For this reason, the circuit board 10 according to the first embodiment can be used for an electronic device placed in high temperature environment such as in an engine room of a vehicle.

As mentioned previously, it is not necessary that the entire electrode 51a becomes AuAl alloy layer 521. At least the interface of the electrode 51a with the connection member 52 becomes AuAl alloy layer 521.

The electrode 51a (i.e., AuAl alloy layer 521) is formed on the first side of the semiconductor chip 50. The electrode 51b and the dummy electrode 51c are formed on a second side, opposite to the first side, of the semiconductor chip 50. The electrodes 51a are arranged at a first pitch. The electrodes 51b and the dummy electrodes 51c are arranged at a second pitch greater than the first pitch. For example, the first pitch is tens of micrometers (e.g. 60 µm), and the second pitch is hundreds of micrometers.

The electrode 51b and the dummy electrode 51c are made of nickel (Ni) material. The electrode 51b is connected to the pad 32 through the first interlayer connection member 41 made of Ag—Sn alloy. The dummy electrode 51c is connected to the pad 33 through the second interlayer connection member 42 made of Ag—Sn alloy. A metal diffusion layer is formed at an interface between the electrode 51b and the first interlayer connection member 41. Specifically, the metal diffusion layer formed between the electrode 51b and the first interlayer connection member 41 is a Ni—Su alloy layer. Likewise, a Ni—Su alloy layer as a metal diffusion layer is formed at an interface between the dummy electrode 51c and the second interlayer connection member 42. The Ni—Su alloy layers improve reliability of connection between the conductor pattern 30 and the interlayer connection member 40. It is noted that at least one element (e.g., Sn) of each of the first and second interlayer connection portions 41, 42 has a melting point lower than a glass-transition point (i.e., softening point) of the thermoplastic resin layer of the insulating member 20. That is, the metal diffusion layer between the electrode 51b and the interlayer connection member 41 is formed by liquid phase diffusion in a step of applying heat and pressure as described later. Likewise, the metal diffusion layer between the electrode 51c and the interlayer connection member 42 is formed by liquid phase diffusion in the step of applying heat and pressure.

As described above, the semiconductor chip 50 has the electrodes 51 on its both sides. Specifically, the electrode 51a is formed on the first side of the semiconductor chip 50, and the electrode 51b and the dummy electrode 51c are formed on the second side of the semiconductor chip 50. Whereas the electrodes 51a, 51b provide electrical connection function the dummy electrode 51c does not provide electrical connection function. A reason for the fact that the semiconductor chip 50 has the electrodes 51a, 51b on the respective sides is that the semiconductor chip 50 includes vertical elements, such as vertical MOSFETs, IGBTs, and resistors, for causing an electrical current to flow in the thickness direction.

The heat sink 60 is made of metal material such as cupper (Cu) and releases heat from the semiconductor chip 50 outside.

According to the first embodiment, the heat sink 60 is made of Cu and has a plate-like shape. The heat sink 60 has the same planar shape and size as the second surface 20b of the insulating member 20. The thermoplastic resin layer 22d, which defines the second surface 20b of the insulating member 20, is in close contact with the heat sink 60, so that the heat sink 60 can be fixed to the insulating member 20.

One end of the second interlayer connection member 42 formed in the thermoplastic resin layer 22d is connected to the heat sink 60. According to the first embodiment a Cu—Sn alloy layer as a metal diffusion layer is formed at an interface between the heat sink 60 made of Cu and the second interlayer connection member 42 made of Ag—Sn alloy. The Cu—Sn alloy layer improves reliability of connection between the heat sink 60 and the second interlayer connection member 42 (as the thermal wiring member).

According to the first embodiment, heat generated in the semiconductor chip 50 is transmitted from the dummy electrode 51c to the heat sink 60 through the thermal wiring member including the second interlayer connection member 42 and the pad 33. Thus, heat radiation performance is improved.

A via hole is formed in the thermosetting resin layers 21a, which defines the first surface 20a of the insulating member 20. The bottom of the via hole is defined by the external connection electrode 35. The via hole is filled with a conductor such as a plated layer. As shown in FIG. 1, a solder ball 70 is formed on the conductor.

In summary, according to the first embodiment, the semiconductor chip 50 has the electrodes 51a, 51b, which provide electrical connection function, on its both sides. The heat sink 60 is provided on the second surface 20b side of the insulating member 20. The external connection electrode 35 is provided on only the first surface 20a side of the insulating member 20. That is, although the semiconductor chip 50 has a both-side electrode structure the circuit board 10 has a one-side electrode structure.

Next, a method of manufacturing the circuit board 10 is described below with reference to FIGS. 2-6. It is noted that the reference number in parenthesis attached to the reference number "40a" indicating a conductive paste represents the reference number of the corresponding interlayer connection portion.

Firstly, a substrate on which the semiconductor chip 50 is mounted is prepared. The substrate on which the semiconductor chip 50 is mounted is hereinafter called the "semiconductor unit 80". Further, resin layers to be stacked on the semiconductor unit 80 are prepared.

As described above, according to the first embodiment, a thermosetting polyimide (PI) film is used for the thermosetting resin layers 21a-21d. For example, each of the thermosetting resin layers 21a-21d has the same thickness (e.g. 50 μm).

In contrast, a resin film containing 30 weight percent of Polyether ether ketone (PEEK) and 70 weight percent of polyether imide (PEI) is used for the thermoplastic resin layers 22a-22d. For example, each of the thermoplastic resin layers 22a, 22c, and 22d has the same thickness (e.g., 80 μm), and the thermoplastic resin layer 22b (as the second resin layer) has the thickness (e.g., 50 μm) less than the thickness of the thermoplastic resin layers 22a, 22c, and 22d.

In this preparing step, the conductor patterns 30 are formed on the resin layers of the insulating member 20, and the via holes filled with the conductive pastes 40a are formed in the resin layers.

The conductor pattern 30 is formed by patterning a conductor foil bonded on the resin layer. At least one of the resin layers of the insulating member 20 has the conductor pattern 30. Therefore, for example, each of the resin layers of the insulating member 20 can has the conductor pattern 30. Alternatively some of the resin layers of the insulating member 20 can have no conductor pattern 30. The conductor pattern 30 can be formed on one side of the resin layer in the thickness direction. Alternatively, the conductor pattern 30 can be formed on both sides of the resin layer in the thickness direction.

The conductive paste 40a is made by mixing conductive particles, a resin material such as ethyl cellulose resin or acrylic resin, and an organic solvent such as terpineol. The via hole is formed in the resin layer by a carbon dioxide laser or the like, and the conductive paste 40a is put in the via hole by a screen printer or the like so that the via hole can be filled with the conductive paste 40a. The via hole can be formed at a position where the conductor pattern 30 is located so that the conductor pattern 30 can be the bottom of the via hole. Alternatively, the via hole can be formed at a position where no conductor pattern 30 is located.

When the via hole is formed at the position where the conductor pattern 30 is located, the conductor pattern 30 serves as the bottom of the via hole. Therefore, the conductive paste 40a can be held in the via hole by the conductor pattern 30. In contrast, when the via hole is formed at the position where no conductor pattern 30 is located, a conductive paste disclosed in JP 2008-296074 can be used for the conductive paste 40a. In this case the conductive paste 40a can be put in the via hole by the apparatus (or method) disclosed in JP 2009-75034.

In the conductive paste disclosed in JP 2008-296074, a low melting point room temperature sold resin is added to conductive particles The low melting point room temperature sold resin is decomposed or volatilized at a first temperature lower than a sintering temperature of the conductive particles and dissolved at a second temperature lower than the first temperature and higher than a room temperature. An example of the low melting point room temperature sold resin is paraffin. Assuming that the conductive paste disclosed in JP 2008-296074 is used for the conductive paste 40a, the conductive paste 40a is injected into the via hole under heat and then cooled. In such an approach, the conductive paste 40a becomes solidified and is held in the via hole. When the conductive paste 40a is injected into the via hole, one end of the via hole can be covered with a planar member such a plate to prevent the injected conductive paste 40a from leaking out of the via hole.

Firstly, a step of preparing six resin layers 21a, 21c, 21d, 22a, 22c, and 22d stacked on the semiconductor unit 80 is described.

Figure 2:
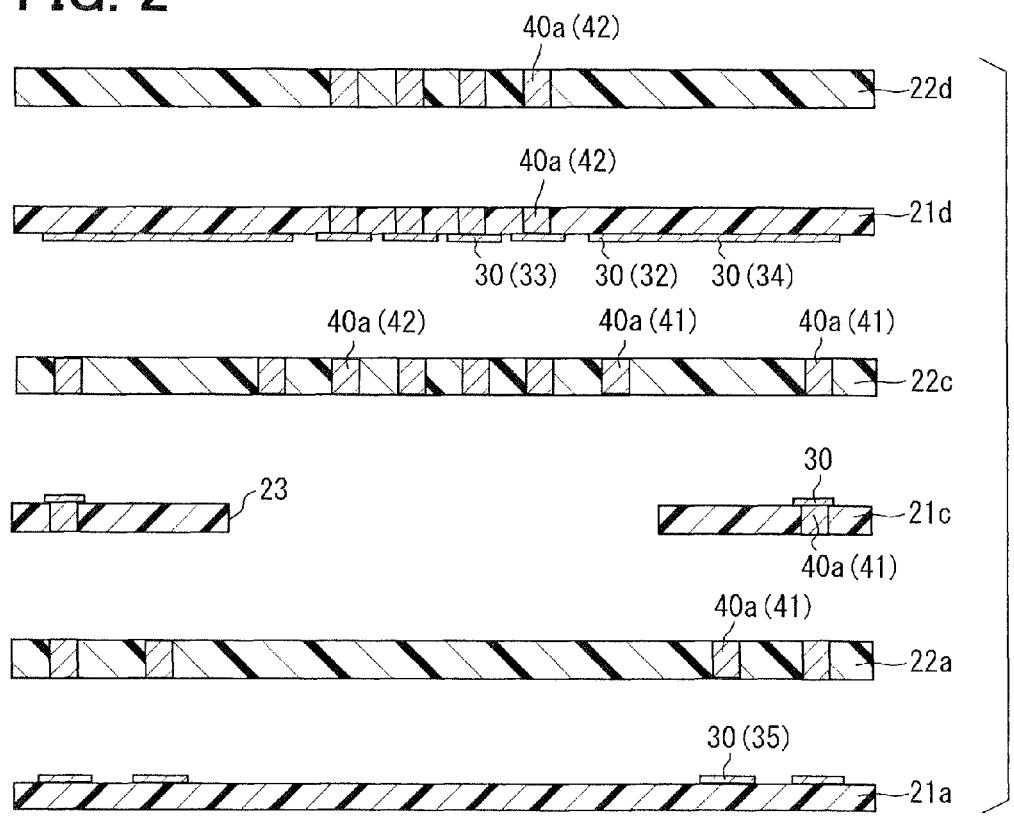
FIG. 2 is a diagram illustrating a preparing step according to the first embodiment.

According to the first embodiment, as shown in FIG. 2, each of the thermosetting resin layers 21a, 21c, and 21d has a copper foil (e.g., 18 μm thickness) on its one side, and the copper foil is patterned into the conductor pattern 30. Likewise, the thermosetting resin layer 21b of the semiconductor unit 80 has a copper foil I (e.g., 18 μm thickness) on its one side, and the copper foil is patterned into the conductor pattern 30.

That is, although each of the thermosetting resin layers 21a-21d has the conductor pattern 30 on its one side each of the thermoplastic resin layers 22a-22d has no conductor pattern 30.

Then, a via hole is formed in each of five resins layers 21c, 21d, 22a, 22c, and 22d, and the conductive paste 40a is placed in the via hole so that the via hole can be filled with the conductive paste 40a. It is noted that the via hole is not formed in the thermosetting resin layer 21a, which defines the first surface 20a of the insulating member 20. Then, a drying step so performed to volatilize solvent.

As described above, according to the first embodiment, although the conductor pattern 30 is formed on the thermosetting resin layers 21a, 21c, and 21d, the conductor pattern 30 is not formed on the thermoplastic resin layers 22a, 22c, and 22d. Therefore, the conductive paste 40a used for the thermoplastic resin layers 22a, 22c, and 22d is made by mixing conductive particles containing Ag and Sn at a predetermined ratio and the low melting point room temperature sold resin such as paraffin. That is, the conductive paste disclosed in JP 2008-296074 is used as the conductive paste 40a for the thermoplastic resin layers 22a, 22c, and 22d.

The conductive paste 40a for the thermoplastic resin layers 22a, 22c, and 22d can be used for the thermosetting resin layers 21a, 21c, and 21d. Alternatively, the conductive paste 40a used for the thermosetting resin layers 21a, 21c, and 21d can be made by mixing conductive particles containing Ag and Sn at a predetermined ratio without the low melting point room temperature sold resin.

Further, in this preparing step, a space for accommodating the semiconductor chip 50 is formed in at least one of the resin layers in advance. According to the first embodiment, a space 23 for accommodating the semiconductor chip 50 is formed in the thermosetting resin layer 21c so that the thermosetting resin layer 21c can have a rectangular ring shape.

The space 23 can be formed by a mechanical processing such as stamping or drilling. Alternatively, the space 23 can be formed by a non-mechanical processing such as irradiation of laser beam The size of the space 23 is a predetermined amount larger than the side of the semiconductor chip 50. The space 23 can be formed after or before the conductor pattern 30 and the interlayer connection member 40 are formed.

A step of forming the semiconductor unit 80 is performed in parallel with the preparing step of preparing the resin layers 21a, 21c, 21d, 22a, 22c, and 22d.

Firstly, a resin layer, which includes the first resin layer and serves as the substrate where the semiconductor chip 50 is mounted, and the second resin layer, which fills the gap between the substrate and the semiconductor chip 50, are prepared.

Figure 3A:
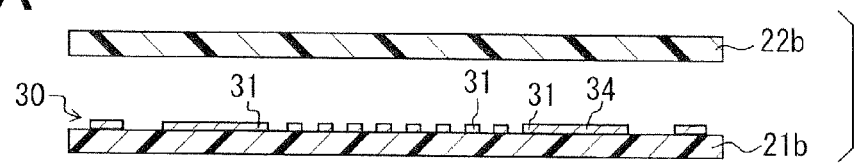
FIGS. 3A-3D are diagrams illustrating a flip-chip mounting step according to the first embodiment.

According to the first embodiment as shown in FIG. 3A, the thermosetting resin layer 21b is prepared as the resin film including the first resin layer and serving as the substrate, and the thermoplastic resin layer 22b is prepared as the second resin layer. The thermosetting resin layer 21b has a copper foil on its one side, and the copper foil is patterned into the conductor pattern 30 including the pad 31.

Then, the thermoplastic resin layer 22b is bonded to the substrate under heat and pressure so that the pad 31 of the substrate can be covered with the thermoplastic resin layer 22b.

Figure 3B:
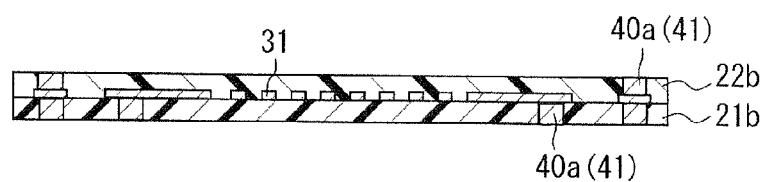

According to the first embodiment, as shown in FIG. 3B and FIG. 4, the thermoplastic resin layer 22b is thermocompression bonded to the thermosetting resin layer 21b as the substrate so that the pad 31 of the thermosetting resin layer 21b can be covered with the thermoplastic resin layer 22b. In FIG. 4, a region indicated by a broken line represents a mount region 24 where the semiconductor chip 24 is mounted.

Specifically, the thermoplastic resin layer 22b is pressed against the thermosetting resin layer 21b while applying heat so that the temperature of the thermoplastic resin layer 22b becomes higher than its glass-transition point and lower than its melting point. Thus, the thermoplastic resin layer 22b becomes softened and is in close contact to the thermosetting resin layer 21b so that the conductor pattern 30 and the pad 31 on the thermosetting resin layer 21b can be covered with the thermoplastic resin layer 22b.

After the thermoplastic resin layer 22b is thermocompression bonded to the thermosetting resin layer 21b, a via hole is formed in each of the resin layers 21b, 22b in such a manner that the conductor pattern 30 can be the bottom of the via hole. Then, as shown in FIG. 3B, the conductive paste 40a is placed in the via hole so that the via hole can be filled with the conductive paste 40a. Since the via hole has the bottom defined by the conductor pattern 30, it is not necessary that the conductive paste 40a placed in the via hole of the resin layers 21b, 22b has the low melting point room temperature sold resin. Alternatively, the conductive paste 40a placed in the via hole of the resin layers 21b, 22b can have the low melting point room temperature sold resin.

Then, the semiconductor chip 50 is mounted on the substrate (i.e., the thermosetting resin layer 21b) in a flip-chip manner as follows.

Figure 8:
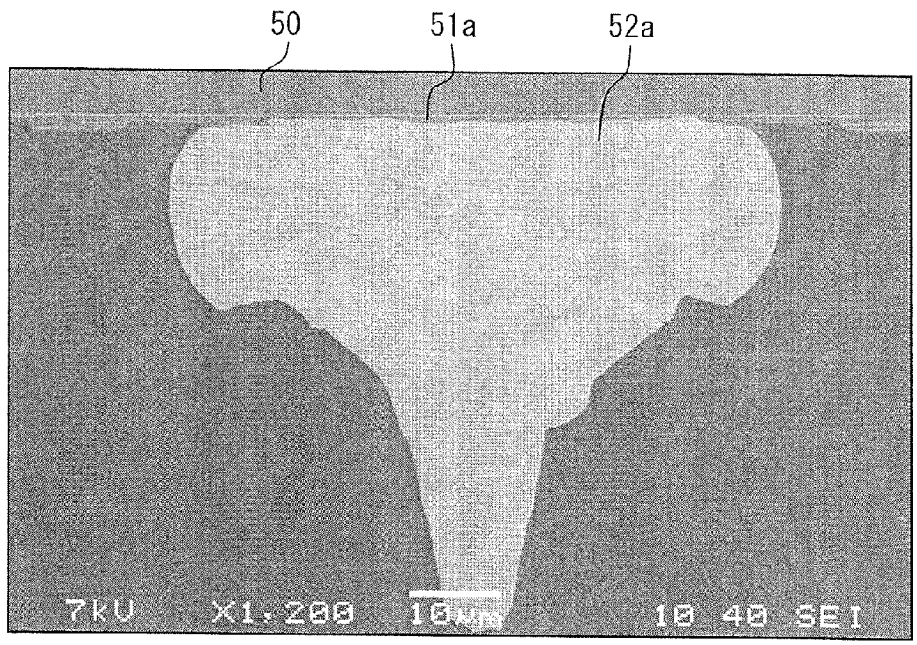
FIG. 8 is a diagram illustrating a stud bump before the flip-chip mounting step according to the first embodiment.

The stud bump 52a is formed on the electrode 51a on the first side of the semiconductor chip 50. According to the first embodiment the stud bump 52a is made of gold (Au) material, and the electrode 51a is made of aluminum (Al) material. For example, the stud bump 52a can be formed on the electrode 51a by a conventional bump forming method using a wire. At this stage, as shown in FIG. 8, Al in the electrode 51a still remains between the semiconductor chip 50 and the stud bump 52a.

Figure 3C:
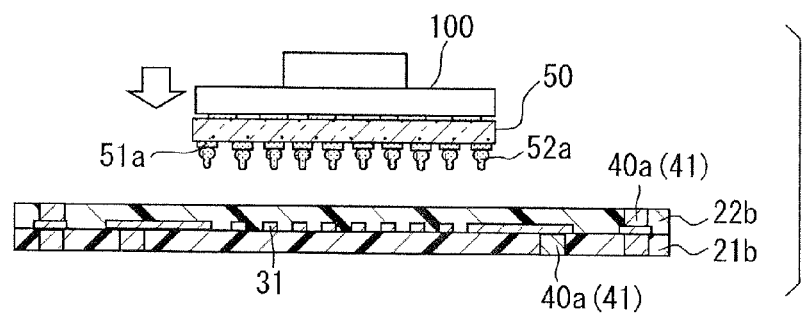

Then, as shown in FIG. 3C, the semiconductor chip 50 is pressed against the substrate by applying heat and pressure to the second side of the semiconductor chip 50, for example, using a pulse heat type thermocompression machine 100. Specifically, the heat is applied so that the thermoplastic resin layer 22b can be heated to a temperature greater than its melting point. For example, assuming that the thermoplastic resin layer 22b consists of 30 weight percent of PEEK and 70 weight percent of PET, the melting point of the thermoplastic resin layer 22b is 330 degrees Celsius (° C.).

Figure 3D:
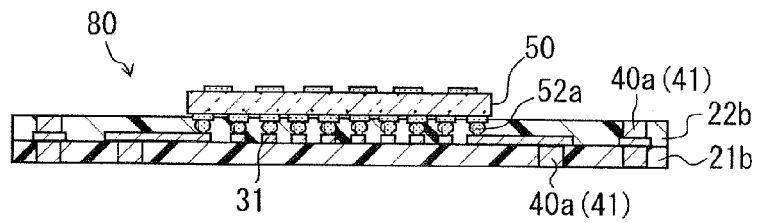
Figure 9:
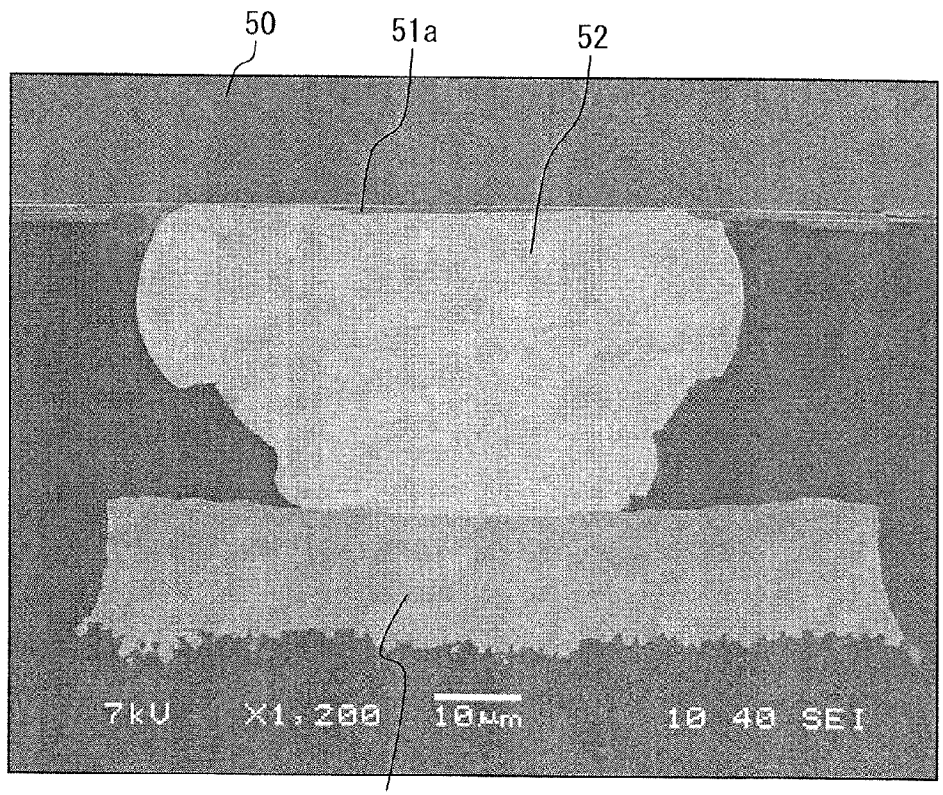
FIG. 9 is a diagram illustrating the stud bump (connection member) after the flip-chip mounting step and before the heat/pressure applying step according to the first embodiment.

When the heat is transmitted from the thermocompression machine 100 to the semiconductor chip 50, and a temperature at a tip of the stud bump 52a exceeds the melting point of the thermoplastic resin layer 22, a portion of the thermoplastic resin layer 22 in contact with the stud bump 52a is melted. Thus, the stud bump 52a is pressed into the thermoplastic resin layer 22 while melting the thermoplastic resin layer 22 and comes into contact with the corresponding pad 31. In this way, as shown in FIG. 3D, the stud bump 52a can be pressed in contact with the pad 31. At this stage, as shown in FIG. 9, Al in the electrode 51a still remains between the semiconductor chip 50 and the stud bump 52a.

The melted and softened thermoplastic resin layer 22b moves like a liquid under pressure and comes in close contact with the first side of the semiconductor chip 50, the electrode 51a, and the stud bump 52a. Thus, as shown in FIG. 3D, the gap between the semiconductor chip 50 and the thermosetting resin layer 21b (i.e., the substrate) is filled with the thermoplastic resin layer 22b. In this way, the semiconductor unit 80 is formed.

According to the first embodiment, the heating temperature in the flip-chip mounting is about 350° C., which is slightly higher than the melting point of the thermoplastic resin layer 22b, and the pressure applied to each stud bump 52a in the flip-chip mounting ranges from about 20 gf to about 50 gf. In such an approach the stud bump 52a can be pressed in contact with the pad 31 in a short time.

If the application of pressure and heat is continued even after the stud bump 52a is pressed in contact with the pad 31, interdiffusion (solid-phase diffusion) between Au in the stud bump 52a and Cu in the pad 31 occurs so that a metal diffusion layer (i.e. Cu—Au alloy layer) can be formed. Further, solid-phase diffusion of Au in the stud bump 52a into Al in the electrode 51a so that a metal diffusion layer (i.e., Au—Al alloy layer) can be formed. However, to form such metal diffusion layers, there is a need to continue the application of pressure and heat for a period much longer than a period necessary to cause the stud bump 52a to be pressed in contact with the pad 31. Therefore the manufacturing time of the circuit board 10 is increased accordingly. As a result, the manufacturing cost of the circuit board 10 is increased. Further, during the period to form the metal diffusion layers, extra pressure and heat are applied to portions other than electrical connection portions between the electrode 51a, the stud bump 52a, and the pad 31. The extra pressure and heat may damage the circuit board 10. For these reasons, in the flip-chip mounting according to the first embodiment, the application of pressure and heat is stopped after the stud bump 52a is pressed in contact with the pad 31.

In the above example, after the thermoplastic resin layer 22b is bonded to the thermosetting resin layer 21b, the via hole is formed in the resin layers 21b, 22b and filled with the conductive paste 40a. Alternatively, before the thermoplastic resin layer 22b is bonded to the thermosetting resin layer 21b, the via hole can be formed in the resin layers 21b, 22b and filled with the conductive paste 40a.

The conductive paste 40a can be sintered to form the interlayer connection members 40 (41) by heat and pressure applied when the semiconductor chip 50 is mounted in a flip-chip manner on the substrate or by heat and pressure applied when the thermoplastic resin layer 22b is bonded to the thermosetting resin layer 21b. Alternatively, the conductive paste 40a may not be partially or fully sintered as of the time when the semiconductor unit 80 is formed. According to the first embodiment, the conductive paste 40a is not sintered as of the time when the semiconductor unit 80 is formed.

Next, a step of forming the stacked body is performed. In this step, the resin layers are stacked in such a manner that the thermoplastic resin layers are at least alternately arranged and that both sides of the semiconductor chip 50 are located adjacent to the thermoplastic resin layers.

Figure 5:
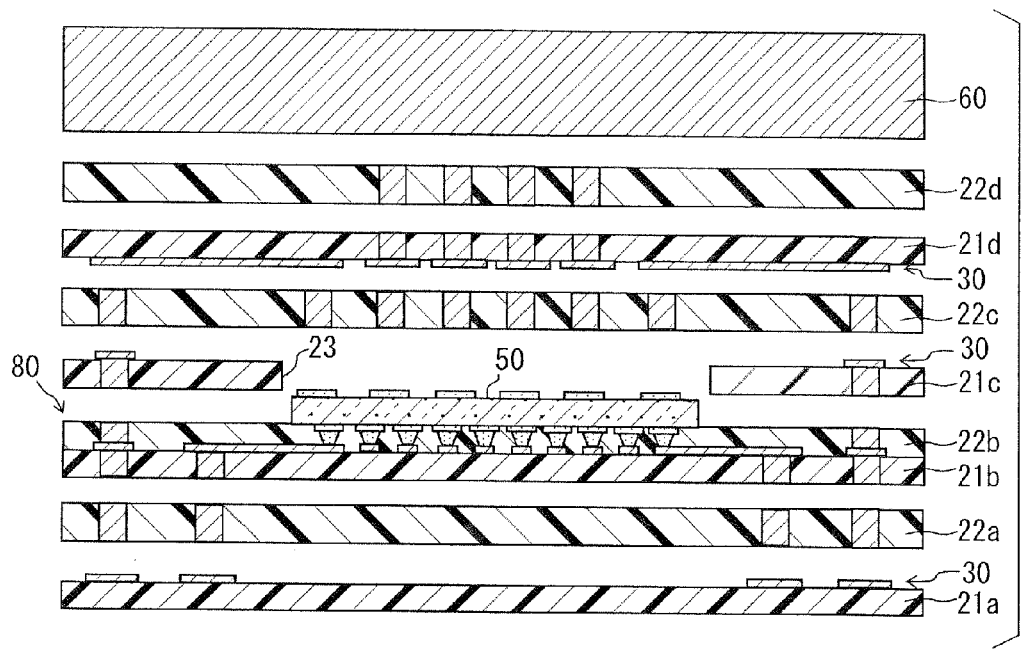
FIG. 5 is a diagram illustrating a stacking step according to the first embodiment.

According to the first embodiment, as shown in FIG. 5, the semiconductor unit 80 and the six resin layers 21a, 21c, 21d, 22a, 22c, and 22d are staked on top of each other in the following order: the thermosetting resin layer 21a, the thermoplastic resin layer 22a, the thermosetting resin layer 21b, the thermoplastic resin layer 22b, the thermosetting resin layer 21c, the thermoplastic resin layer 22c, the thermosetting resin layer 21d, and the thermoplastic resin layer 22d. In this way, according to the first embodiment, the thermoplastic resin layers 22a-22d alternate with the thermosetting resin layers 21a-21d.

Further, the heat sink 60 is stacked on the thermoplastic resin layer 22d.

Specifically, the thermoplastic resin layer 22a is placed on a side, where the conductor pattern 30 is formed, of the thermosetting resin layer 21a. The semiconductor unit 80 is placed on the thermoplastic resin layer 22a in such a manner that the thermosetting resin layer 21b of the semiconductor unit 80 can be located on the thermoplastic resin layer 22a. A side, where the conductor pattern 30 is not formed, of the thermosetting resin layer 21c is placed on the thermoplastic resin layer 22b of the semiconductor unit 80 so that the semiconductor chip 50 of the semiconductor unit 80 can be enclosed with the thermosetting resin layer 21c. The thermoplastic resin layer 22c is placed on the semiconductor chip 50 and the other side of the thermosetting resin layer 21c. A side, where the conductor pattern 30 is formed, of the thermosetting resin layer 21d is placed on the thermoplastic resin layer 22c. The thermoplastic resin layer 22d is placed on the thermosetting resin layer 21d. Further, the heat sink 60 is placed on the thermoplastic resin layer 22d so that a single stacked body can be formed.

In the stacked body, the thermoplastic resin layers 22b, 22c are located adjacent to the semiconductor chip 50 in the staked direction (i.e., the thickness direction). As described in detail later, after application of pressure and heat, the semiconductor chip 50 is sealed and encapsulated with the thermoplastic resin layers 22b, 22c.

It is preferable that not only organic material such as glass fiber or agamid fiber but also inorganic filler for adjustment of linear expansion coefficient or a melting point are not contained in the thermoplastic resin layers 22b, 22c. In such an approach local stress applied by the thermoplastic resin layers 22b, 22c to the semiconductor chip 50 under heat and pressure can be reduced.

However, when inorganic filler for adjustment of linear expansion coefficient or a melting point is not contained in the thermoplastic resin layers 22b, 22c, stress applied by the thermoplastic resin layers 22b, 22c to the semiconductor chip 50 may be increased due to a difference in thermal expansion coefficient between the semiconductor chip 50 and the thermoplastic resin layers 22b, 22c. Therefore, it is preferable that the thermoplastic resin layers 22b, 22c should be made of a material having low elastic modulus (e.g., 10 GPa or less).

Further, it is preferable that the thickness of each of the thermoplastic resin layers 22b, 22c be 5 μm or more. If the thickness of each of the thermoplastic resin layers 22b, 22c is less than 5 μm, the thermoplastic resin layers 22b, 22c may be peeled off from the semiconductor chip 50 due to stress increased under pressure and heat.

Then, a step of applying heat and pressure to the stacked body from its both sides in the stacked direction is performed using a vacuum thermal pressing machine. In this step, the thermoplastic resin layers of the stacked body are softened so that all the resin layers of the stacked body can be joined together into a single insulating member 20 at a time. As a result, the semiconductor chip 50 is encapsulated in the insulating member 20, and the conductive particles in the conductive paste 40a are sintered and joined to the conductor pattern 30 to form the wiring member.

In this step, in order to join together the resin layers of the stacked body into the insulating member 20 and in order to form the sintered body by sintering the conductive particles in the conductive paste 40a, heat greater than the glass-transition point and less than the melting point of the thermoplastic resin layer is continuously applied to the stacked body for a predetermined period of time, and pressure of about several MPa is continuously applied to the stacked body for the predetermined period of time. According to the first embodiment heat of from about 280° C. to about 330° C. is continuously applied to the stacked body for five or more minutes (e.g., ten minutes), and pressure of from about several 4 MPa to about 5 MP is continuously applied to the stacked body for five or more minutes.

In the step of applying heat and pressure the resin layers are joined together in the following way.

The thermoplastic resin layers 22a-22d, which alternate with the thermosetting resin layers 21a-21d, are softened under heat. Further, under pressure, the softened thermoplastic resin layers 22a-22d are in close contact with the thermosetting resin layers 21a-21d located adjacent to the softened thermoplastic resin layers 22a-22d. Thus, the thermosetting resin layers 21a-21d and the thermoplastic resin layers 22a-22d are joined together into the insulating member 20 at a time. Further, the softened thermoplastic resin layers 22d is in close contact with the heat sink 60 so that the insulating member 20 and the heat sink 60 can be joined together into a single circuit board 10.

The thermoplastic resin layers 22b, 22c located adjacent to the semiconductor chip 50 move like a liquid under pressure. Therefore, the thermoplastic resin layers 22b, 22c are in close contact with the first side of the semiconductor chip 50, where the electrode 51a is formed, and the second side of the semiconductor chip 50, where the electrodes 51b, 51c are formed. Further, the thermoplastic resin layers 22b, 22c move into a clearance between a side surface of the semiconductor chip 50 and the thermosetting resin layer 21c to fill the clearance. Thus, the thermoplastic resin layers 22b, 22c are in close contact with the side surface of the semiconductor chip 50. Therefore, the semiconductor chip 50 is sealed and encapsulated with the thermoplastic resin layers 22b, 22c.

In the step of applying heat and pressure, the electrode 51 of the semiconductor chip 50, the conductor pattern 30, and the interlayer connection member 40 are connected in the following way.

Due to the application of heat, Sn (melting point of 232° C.) in the conductive paste 40a is melted and diffused into Ag particles in the conductive paste 40a so that Ag—Sn alloy (melting point of 480° C.) can be formed. Further, the conductive paste 40a is sintered under pressure so that the interlayer connection member 40 (41, 42) as sintered alloy can be formed in the via hole.

It is noted that interdiffusion of the melted Sn with Cu in the conductor pattern 30 (pads 31-33) occurs. Thus, a metal diffusion layer (Cu—Sn alloy layer) is formed at an interface between the interlayer connection member 40 and the conductor pattern 30.

Further, interdiffusion of the melted Sn with Ni in the electrodes 51b, 51c of the semiconductor chip 50 occurs. Thus, a metal diffusion layer (Ni—Sn alloy layer) is formed at an interface between the interlayer connection member 40 and the electrodes 51b, 51c.

Figure 10:
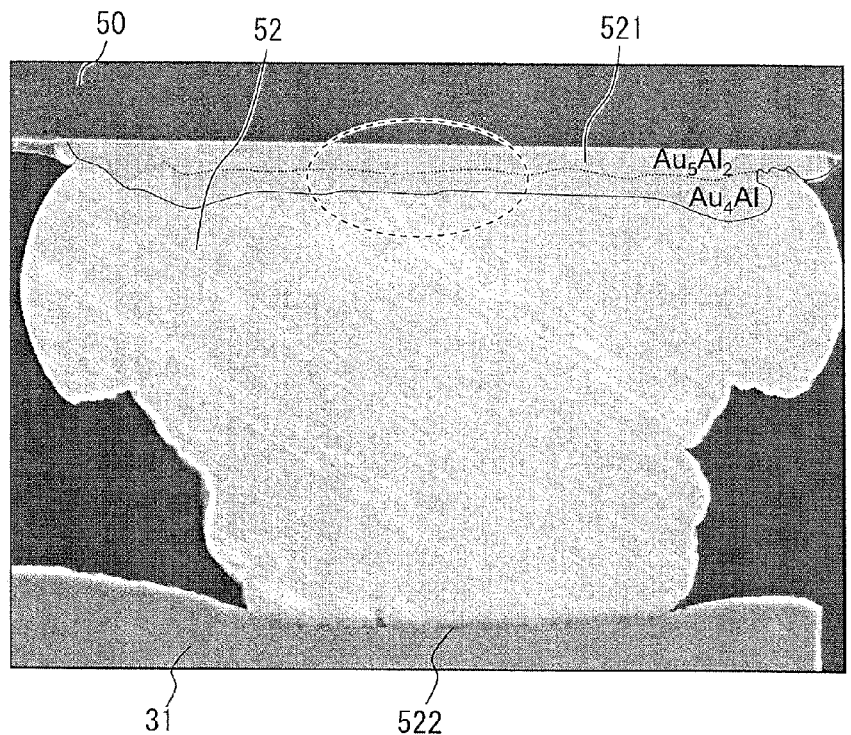
FIG. 10 is a diagram illustrating the stud bump (connection member) after the heat/pressure applying step according to the first embodiment.

Further, solid-phase diffusion of Au in the stud bump 52a into Al in the electrode 51a of the semiconductor chip 50 occurs so that the electrode 51a can change to the AuAl alloy layer 521. Since the electrodes 51a are arranged at a fine (i.e., narrow) pitch, the amount of Al in the electrode 51a is less than the amount of Au in the stud bump 52a. Therefore, all Al in the electrode 51a is consumed to form the AuAl alloy layer 521a. As a result, the AuAl alloy layer 521a, which is formed after the step of applying heat and pressure, has no elemental aluminum. The AuAl alloy layer 521 has mainly $Au_4Al$ alloy. For example, as shown in FIG. 10, the AuAl alloy layer 521 can contains $Au_4Al$ and $Au_5Al_2$.

Figure 11:
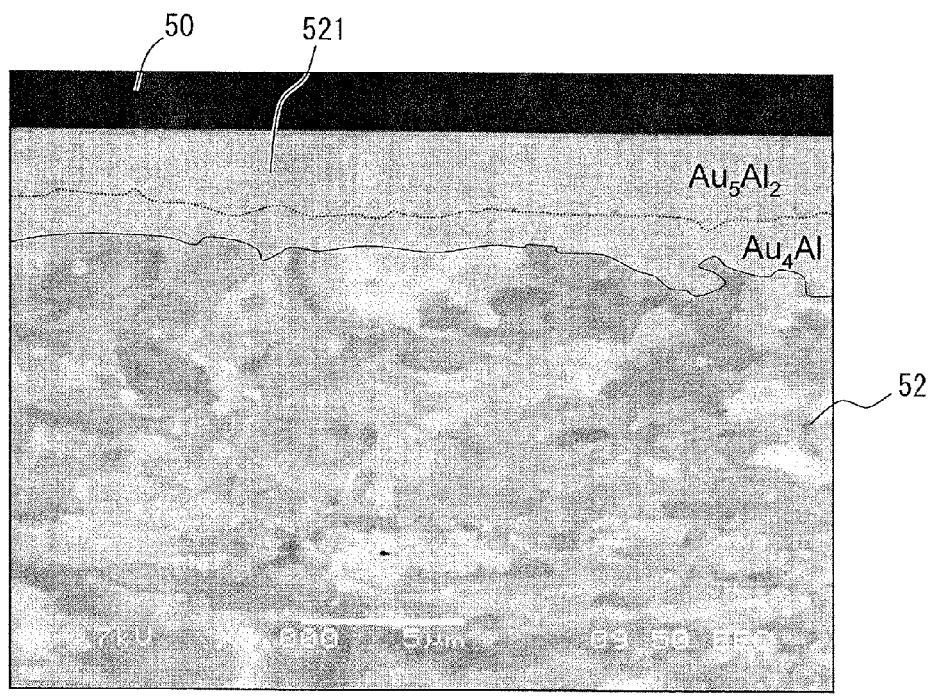
FIG. 11 is a diagram illustrating an enlarged view of a portion enclosed by a broken line in FIG. 10.

As mentioned previously, the growing rate of $Au_5Al_2$ is greater than the growing rate of $Au_4Al$. Therefore, $Au_5Al_2$ may be generated before $Au_4Al$ is generated. Even in such a case, the application of pressure can reduce the formation of the Kirkendall void, as shown in FIGS. 10 and 11. It is noted that FIG. 10 illustrates a case where the thickness of the electrode 51a is 1.0 µm.

Figure 12:
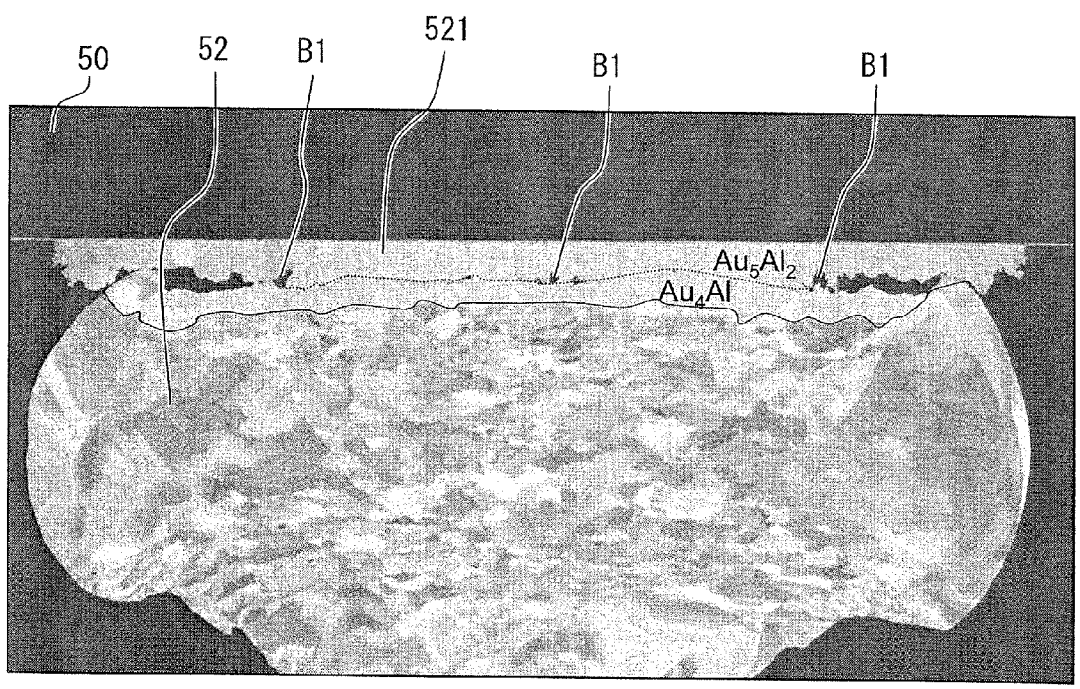
FIG. 12 is a diagram illustrating a comparison example in which a circuit board is formed without application of pressure.

FIG. 12 illustrates a comparison example in which the circuit board is formed without application of pressure. As can be seen from FIG. 12, when the circuit board is formed without application of pressure, a void B1 occurs.

Referring back to the first embodiment, interdiffusion of Au in the stud bump 52a with Cu in the conductor pattern 30 (pad 31) occurs. Thus, as shown in FIG. 10, the CuAu alloy layer 522 (preferably, $CuAu_3$ alloy layer) is formed at an interface between the pad 31 and the connection member 52, which is derived from the stud bump 52a. The CuAu alloy layer 522 can be formed by application of heat of about 250° C. According to the first embodiment heat and pressure are applied so that the CuAu alloy layer 522 can be a $CuAu_3$ alloy layer.

The remaining stud bump 52a (i.e., Au not consumed in the solid-phase diffusion with Al in the electrode 51a) serves as the connection member 52 for electrically connecting the AuAl alloy layer 521 and the pad 31. Thus, the stud bump 52a and the pad 31 are directly joined together by the step of applying heat and pressure.

Figure 13:
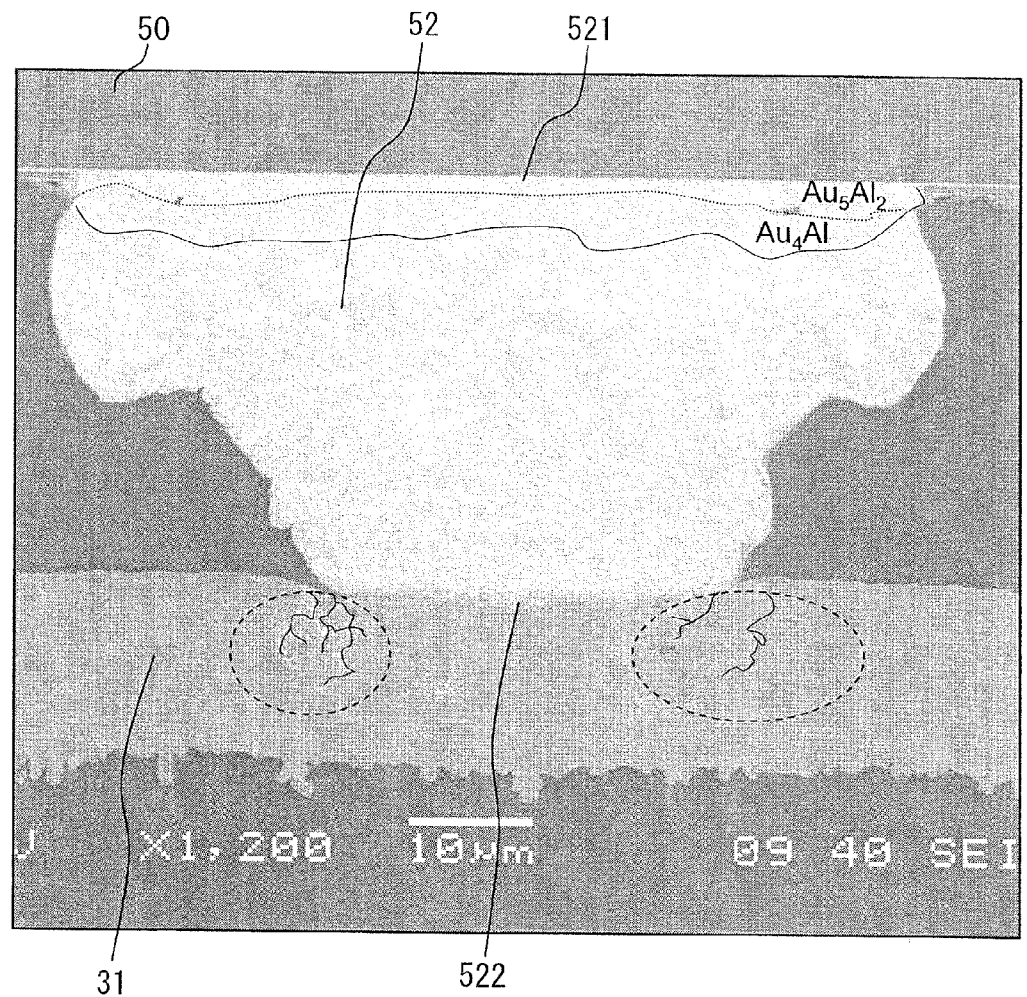
FIG. 13 is a diagram illustrating the stud bump (connection member) after the heat/pressure applying step.
Figure 14:
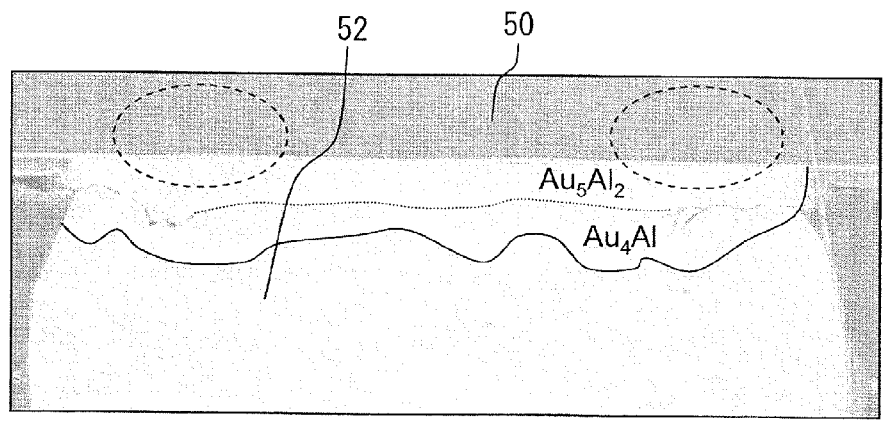
FIG. 14 is a diagram illustrating a partial enlarged view of FIG. 13.

It is preferable that elastic modulus of Cu in the pad 31 be less than elastic modulus of Au in the connection member 52 (stud bump 52a). In such an approach, thermal stress due to a difference in thermal expansion coefficient between the semiconductor chip 50 and the insulating member 20 can be concentrated on the pad 31. Thus, as shown in FIG. 13, the pad 31 can be cracked to absorb the thermal stress applied to the semiconductor chip 50. Therefore, as shown in FIG. 14, the semiconductor chip 50 can be protected from damage caused by a crack.

Figure 6:
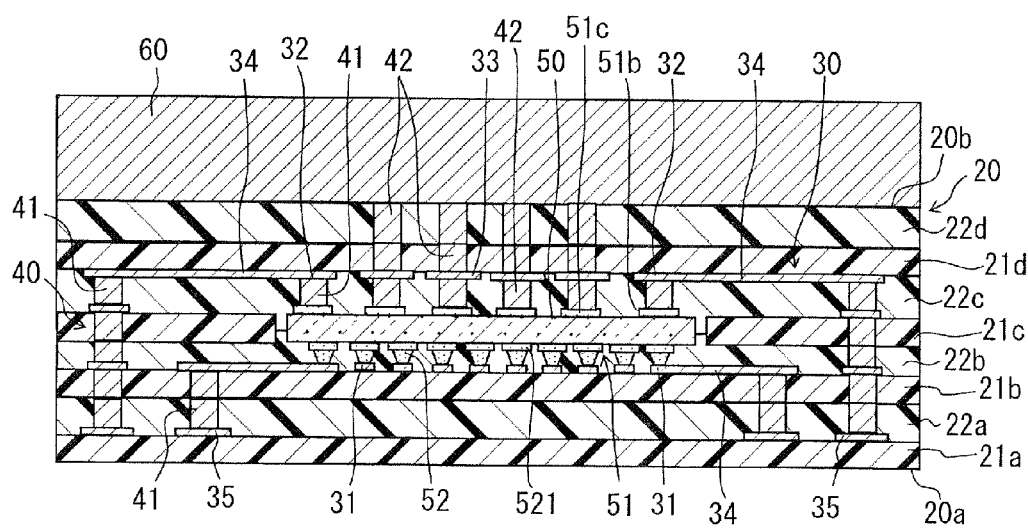
FIG. 6 is a diagram illustrating a heat/pressure applying step according to the first embodiment.

By the above manufacturing steps the structure shown in FIG. 6 can be obtained.

Then, the via hole is formed in the thermosetting resin layers 21a, which defines the first surface 20a of the insulating member 20. The bottom of the via hole is defined by the external connection electrode 35. The via hole is filled with a conductor such as a plated layer. Then, the solder ball 70 is formed on the conductor. Thus the circuit board 10 shown in FIG. 1 can be manufactured.

Advantages of the first embodiment described above can be summarized as follows.

According to the first embodiment, the stacked body is formed by stacking the thermosetting resin layers 21a-21d and the thermoplastic resin layers 22a-22d in such a manner that at least one of the thermoplastic resin layer 22a-22d is interposed between adjacent thermosetting resin layers 21a-21d and that the semiconductor chip 50 is interposed between adjacent thermoplastic resin layers 22a-22d.

In such an arrangement of the resin layers, when pressure and heat are applied to the stacked body, the thermoplastic resin layer 22a-22d serve as adhesives so that the thermosetting resin layers 21a-21d and the thermoplastic resin layers 22a-22d can be joined together into the insulating member 20 at a time. Further, since the semiconductor chip 50 is interposed between adjacent thermoplastic resin layers 22b, 22c, the semiconductor chip 50 can be sealed and encapsulated in the insulating member 20. Furthermore, due to the application of heat and pressure, the conductive particles in the conductive paste 40a are sintered and joined to the conductor pattern 30 to form the wiring member. Thus, the manufacturing process of the circuit board 10 can be simplified.

According to the first embodiment, due to the application of pressure and heat, solid-phase diffusion of Au in the stud bump 52a into Cu in the pad 31 occurs so that the CuAu alloy layer 522 can be formed. Further, solid-phase diffusion of Au in the stud bump 52a into Al in the electrode 51a occurs so that the AuAl alloy layer 521 having no elemental aluminum can be formed. That is, the portion of the electrode 51a facing the connection member 52 in the thickness direction becomes AuAl alloy layer 521. Therefore, even in high temperature environment, the Kirkendall void caused by diffusion of Au can be reduced. Further, since the AuAl alloy layer 521 and the CuAu alloy layer 522 are formed and sealed in the same step, the manufacturing process can be simplified.

For the above reasons, the reliability of connection of the semiconductor chip 50 is improved while simplifying the manufacturing process of the circuit board 10. Thus, the manufacturing time of the circuit board 10 can be reduced.

Further, according to the first embodiment, the CuAu alloy layer 522 is located at the interface between the stud bump 52a and the pad 31, and the AuAl alloy layer 521 is located between the semiconductor chip 50 and at least the portion of the stud bump 52a. In such an approach, the reliability of connection of the semiconductor chip 50 can be improved.

Further, according to the first embodiment prior to the step of forming the stacked body, heat higher than the melting point of the thermoplastic resin layer 22b is applied to the thermoplastic resin layer 22b interposed between the semiconductor chip 50 and the substrate (i.e. thermosetting resin layer 21b) under pressure. Thus, the thermoplastic resin layer 22b is melted and moves like a liquid during the application of heat. Further, the application of pressure causes the melted thermoplastic resin layer 22b to move away from between the stud bump 52a and the pad 31. Thus, the stud bump 52a comes into direct contact with the pad 31 and is pressed in contact with the pad 31. Then after the application of heat and pressure is stopped, the thermoplastic resin layer 22b is hardened so that the stud bump 52a can remain pressed in contact with the pad 31.

At this time, the melted thermoplastic resin layer 22b moves into the gap between the semiconductor chip 50 and the substrate (i.e., the thermoplastic resin layer 22b). Thus, the gap between the semiconductor chip 50 and the substrate is filled with the thermoplastic resin layer 22b so that the stud bump 52a and the pad 31 can be covered with the thermoplastic resin layer 22b.

When the stud bump 52a is pressed in contact with the pad 31, the application of heat and pressure is stopped so that the stud bump 52a can remain pressed in contact with the pad 31. Thus, reliability of electrical connection between the electrode 51a of the semiconductor chip 50 and the pad 31 can be improved.

In the flip-chip mounting step, the stud bump 52a and the pad 31 are pressed into contact with each other. Then, in the heat/pressure applying step, the stud bump 52a and the pad 31, which remain pressed into contact with each other, are joined together under pressure and heat. In such an approach, the manufacturing time can be reduced.

If the heat/pressure applying step is performed under a condition where the stud bump 52a is not in contact with the pad 31 there is a possibility that the thermoplastic resin layer 22b remains between the stud bump 52a and the pad 31 due to cushioning action of the softened thermoplastic resin layer 22b.

In contrast, according to the first embodiment, the heat/pressure applying step is performed under a condition where the stud bump 52a is pressed into contact with the pad 31. Therefore, the stud bump 52a and the pad 31 can be surely joined together by heat and pressure applied in the heat/pressure applying step.

Further, according to the first embodiment, the conductor pattern 30 is formed on the thermosetting resin layers 21a-21d but is not formed on the thermoplastic resin layer 22a-22d In such an approach, when the thermoplastic resin layer 22a-22d are melted and move like a liquid under pressure and heat, the conductor pattern 30 is supported to the thermosetting resin layers 21a-21d and thus remains in its original position. Therefore, the conductor patterns 30 can be arranged at a fine pitch.

In the case of solid-phase diffusion bonding of the electrode 51, pressure applied through the electrode 51 to the semiconductor chip 50 during the heat/pressure applying step is large. In particular, when the electrodes 51 on both sides of the semiconductor chip 50 are bonded by solid-phase diffusion bonding the pressure applied through the electrodes 51 to the semiconductor chip 50 is very large.

In contrast, according to the first embodiment, although the electrode 51a on one side of the semiconductor chip 50 is bonded by solid-phase diffusion bonding, the electrodes 51b, 51c on the other side of the semiconductor chip 50 are bonded by liquid phase diffusion bonding. In such an approach the pressure applied to one side of the semiconductor chip 50 is absorbed by the other side of the semiconductor chip 50. Thus, pressure applied to the semiconductor chip 50 during the heat/pressure applying step is reduced so that the semiconductor chip 50 can be protected from damage. Therefore reliability of the semiconductor chip 50 can be improved.

Further, according to the first embodiment, the thermoplastic resin layers 22a-22d contain no inorganic material such as glass fiber and no inorganic filler. Therefore pressure applied to the semiconductor chip 50 during the heat/pressure applying step can be more reduced.

Second Embodiment

A second embodiment of the present invention is described below with reference to FIGS. 15A and 15B. A difference between the first embodiment and the second embodiment is as follows.

In the first embodiment, when the semiconductor chip 50 is mounted in a flip-chip manner on the thermosetting resin layer 21b as the substrate, the stud bump 52a is pressed in contact with the pad 31 on the thermosetting resin layer 21b by pressing the stud bump 52a into the thermoplastic resin layer 22b that is bonded on the side of the thermosetting resin layer 21b, where the pad 31 is formed.

Figure 15A:
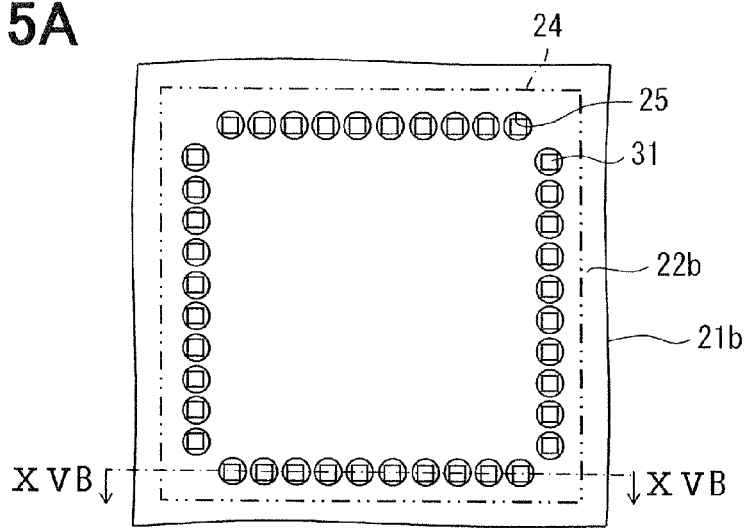
FIG. 15A is a diagram illustrating a top view of a second resin layer bonded to a substrate according to a second embodiment of the present invention.
Figure 15B:
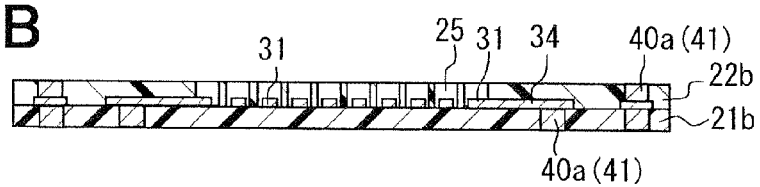
FIG. 15B is a diagram illustrating a cross-sectional view taken along the line XVB-XVB in FIG. 15A.

In contrast, according to the second embodiment, as shown in FIGS. 15A and 15B, a through hole 25 is formed in the thermoplastic resin layer 22b at a position corresponding to the pad 31, and the thermoplastic resin layer 22b is bonded on the side of the thermosetting resin layer 21b, where the pad 31 is formed, so that the pad 31 can be located in the corresponding through hole 31.

In an example shown in FIGS. 15A and 15B, the through hole 25 is provided for each pad 31. In such an approach, adjacent stud bumps 52a (and adjacent pads 31) are separated from each other by the hermoplastic resin layer 22b so that each stud bump 52a (and each pad 31) can be covered with the softened thermoplastic resin layer 22b in the flip-chip mounting step. Thus electrical insulation between adjacent stud bumps 52a (and adjacent pads 31) can be ensured.

If the electrodes 51a of the semiconductor chip 50 are arranged at a fine pitch, the pads 31 needs to be arranged at the same fine pitch. Therefore, it is difficult to form the through hole 25 having the size smaller than the size (e.g., diameter of 30 μm) of the pad 31. However, unlike the via hole for forming the interlayer connection member 40, the through hole 25 is not filled with the conductive paste 40a. Further, since the size of the connection member 52, which electrically connects the electrode 51a and the pad 31, does not depend on the size of the through hole 25, the through hole 25 can be larger than the pad 31. Therefore flexibility of size of the through hole 25 is high so that the through hole 25 can be provided for each pad 31.

Specifically, after the thermoplastic resin layer 22b having the through holes 25 is placed on the thermosetting resin layer 21b so that each pad 31 can be located in the corresponding through hole 25, the semiconductor chip 50 is mounted in a flip-chip manner on the thermosetting resin layer 21b under pressure and heat greater than the glass-transition point of the thermoplastic resin layer 22b. Thus, the stud bump 52a of the semiconductor chip 50 is pressed in contact with the corresponding pad 31 through the through hole 25, and the gap between the semiconductor chip 50 and the thermosetting resin layer 21b can be filled with the softened thermoplastic resin layer 22b.

The above manufacturing method according to the second embodiment can have the same advantage as the manufacturing method according to the first embodiment.

In addiction, according to the second embodiment, there is no need to melt the thermoplastic resin layer 22b in order to cause the stud bump 52a to be pressed in contact with the pad 31, although there is a need to soften the thermoplastic resin layer 22b so that the gap between the semiconductor chip 50 and the thermosetting resin layer 21b can be filled the softened thermoplastic resin layer 22b. In other words, there is no need to melt the thermoplastic resin layer 22b, as long as the semiconductor chip 50 is thermocompression bonded to the thermoplastic resin layer 22b. Since the through holes 25 are formed in the thermoplastic resin layer 22b before the flip-chip bonding, the stud bump 52a can be pressed in contact with the pad 31 easily.

Therefore, the stud bump 52a can be pressed in contact with the pad 31 in a shorter time. Accordingly, the manufacturing time can be reduced.

In other words, the method according to the second embodiment can cause the stud bump 52a to be pressed in contact with the pad 31 with the amount of heat less the amount of heat necessary for the method according to the first embodiment.

According to the first embodiment, after the thermoplastic resin layer 22b is bonded to the thermosetting resin layer 21b, the through hole 25 is formed by a carbon dioxide laser or the like. In such an approach, the through hole 25 can be positioned accurately with respect to the pad 31.

Alternatively, the through hole 25 can be formed by a carbon dioxide laser or the like, before the thermoplastic resin layer 22b is bonded to the thermosetting resin layer 21b. In such a case, it is preferable that the thermoplastic resin layer 22b be bonded to the thermosetting resin layer 21b by applying heat and pressure to a portion other than the through hole 25. In such an approach, deformation of the through hole 25 is prevented so that the stud bump 52a can be pressed in contact with the pad 31 easily when the semiconductor chip 50 is mounted in a flip-flop manner.

Figure 16A:
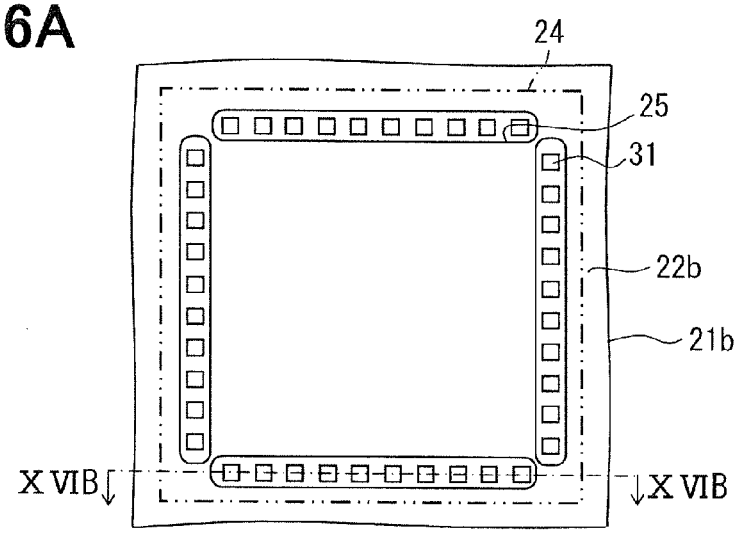
FIG. 16A is a diagram illustrating a top view of a second resin layer bonded to a substrate according to a modification of the second embodiment.
Figure 16B:
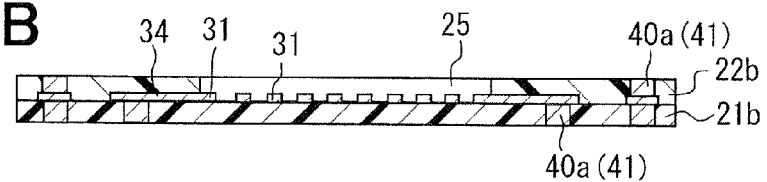
FIG. 16B is a diagram illustrating a cross-sectional view taken along the line XVIB-XVIB in FIG. 16A.

As described above, according to the second embodiment, one through hole 25 is provided for each pad 31. Alternatively, as shown in FIGS. 16A and 16B, one through hole 25 can be provided for multiple pads 31. In an example shown in FIGS. 16A and 16B, the pads 31 are arranged in a rectangular ring with a side defined by ten pads 31 arranged in line, and one through hole 25 is provided for the ten pads 31. Thus, the through hole 25 has a long shape in one surface direction.

According to the example shown in FIGS. 16A and 16B, the through hole 25 can be formed independently of the arrangement pitch between the pads 31. Therefore, the second embodiment can be suitable for a fine pitch arrangement of the pads 31, i.e., the electrodes 51a of the semiconductor chip 50.

(Modifications)

The embodiments described above can be modified in various ways, for example, as follows.

In the embodiments, the semiconductor chip 50, the thermosetting resin layer 21b (i.e., first resin layer), and the thermoplastic resin layer 22b (i.e., second resin layer) are assembled into the semiconductor unit 80, before the stacking step and the pressure/heat applying step are performed. Alternatively, the stacking step can be performed under a condition where the semiconductor chip 50, the thermosetting resin layer 21b, and the thermoplastic resin layer 22b remains separated from each other. In this case, the thermosetting resin layer 21b is arranged in the staking step in such a manner that the pad 31 of the thermosetting resin layer 21b faces the stud bump 52a of the semiconductor chip 50 through the thermoplastic resin layer 22b. That is, in the staking step shown in FIG. 5, the thermosetting resin layer 21b, the thermoplastic resin layer 22b, and the semiconductor chip 50 are arranged in this order (viewed from the bottom of the sheet) instead of the semiconductor unit 80. Then, in the pressure/heat applying step, the stud bump 52a is pressed into the thermoplastic resin layer 22b by melting the thermoplastic resin layer 22b, so that the first electrode 51a and the stud bump 52a can be bonded together by solid-phase diffusion bonding and that the pad 31 and the stud bump 52a can be bonded together by solid-phase diffusion bonding. In such an approach, the step of forming the semiconductor unit 80 is omitted so that the manufacturing time of the circuit board 10 can be reduced.

In the embodiments, the insulating member 20 is formed by using eight resin layers. The number of the resin layers used to form the insulating member 20 is not limited, as long as the number allows the insulating member 20 to encapsulate the semiconductor chip 50.

The material of the thermoplastic resin layer cannot be limited to the material described in the embodiments. For example, the thermoplastic resin layer can consist of PEEK and PEI at a mixture ratio different from that (i.e., 3:7) of the embodiments. The thermoplastic resin layer can be made of a material different from a mixture of PEEK and PEI. For example, the thermoplastic resin layer can be made of liquid crystal polymer (LCP), tetrafluoroethylene-hexafluoropropylene (FEP), tetrafluoroethylene-co-perfluoropropyl vinyl ether (PFA), or Polyphenylene Sulfide (PPS).

In the embodiments, each of the thermoplastic resin layers 22a-22d contains no inorganic material such as glass fiber or agamid fiber and no inorganic filler for adjustment of linear expansion coefficient or melting point. Alternatively, the thermoplastic resin layers 22a-22d can contain such materials. However, as mentioned previously, it is preferable that organic material such as glass fiber or agamid fiber and inorganic filler for adjustment of linear expansion coefficient or a melting point be not contained in the thermoplastic resin layers (i.e., 22b, 22c) where the semiconductor chip 50 is encapsulated. In such an approach, local stress applied by the thermoplastic resin layers to the semiconductor chip 50 under heat and pressure can be reduced.

The material of the thermosetting resin layer cannot be limited to the material described in the embodiments. In the embodiments, each of the thermosetting resin layers 21a-21d is a thermosetting polyimide (PI) film containing no inorganic material such as glass fiber. Alternatively, the thermosetting resin layers 21a-21d can be a thermosetting film containing inorganic material such as glass fiber.

In the embodiments, the insulating member 20 is formed with equal numbers of thermosetting resin layers and thermoplastic resin layers. Alternatively, the insulating member 20 can be formed with different numbers of thermosetting resin layers and thermoplastic resin layers as long as the number of thermoplastic resin layers is greater than the number of thermosetting resin layers so that each thermosetting resin can be sandwiched between adjacent thermoplastic resin layers. For example, the insulating member 20 can be formed with only thermoplastic resin layers.

In the embodiments, the first resin layer (i.e., thermosetting resin layer 21b), on which the semiconductor chip 50 is mounted in a flip-chip manner, is a thermosetting resin layer. Alternatively, the first resin layer can be a thermoplastic resin layer. Alternatively, the first resin layer can have a multilayer structure, for example, including both thermosetting resin layer and thermoplastic resin layer.

In the embodiments, the heat sink 60 is fixed to the second surface 20b of the insulating member 20 to improve heat radiation performance. Further, the dummy electrode 51c is provided in the semiconductor chip 50 and connected to the thermal wiring member (i.e., the second interlayer connection member 42 and the pad 33) to improve heat radiation performance. Alternatively, the heat sink 60 and the thermal wiring member can be omitted. It is preferable that at least one of the heat sink 60 and the thermal wiring member be included.

In the embodiments, the heat sink 60 covers the entire second surface 20b of the insulating member 20. Alternatively, the heat sink 60 can cover part of the second surface 20b of the insulating member 20. Alternatively, the heat sink 60 can be fixed to each of the first and second surfaces 20a, 20b of the insulating member 20.

In the embodiments, the semiconductor chip 50 has the electrodes 51 on its both sides, and the electrodes 51 include the AuAl alloy layer 521, the electrode 51b, and the dummy electrode 51c. Alternatively the electrode 51b and the dummy electrode 51c can be omitted. For example, the semiconductor chip 50 can have the AuAl alloy layer 521 on one side and can have only the dummy electrode 51c on the other side. Even in this case, pressure applied to the semiconductor chip 50 in the heat/pressure applying step can be reduced by achieving electrical connection between the dummy electrode 51c and the pad 33 by liquid phase diffusion.

The thickness of the resin layer and the thickness of the conductor pattern 30 are not limited to those of the embodiments. As mentioned previously, however, it is, preferable that the thickness of each of the thermoplastic resin layers 22b, 22c for encapsulating the semiconductor chip 50 be 5 μm or more.

(Example of Modifications)

One example of the modifications is described below with reference to FIG. 17.

Figure 17:
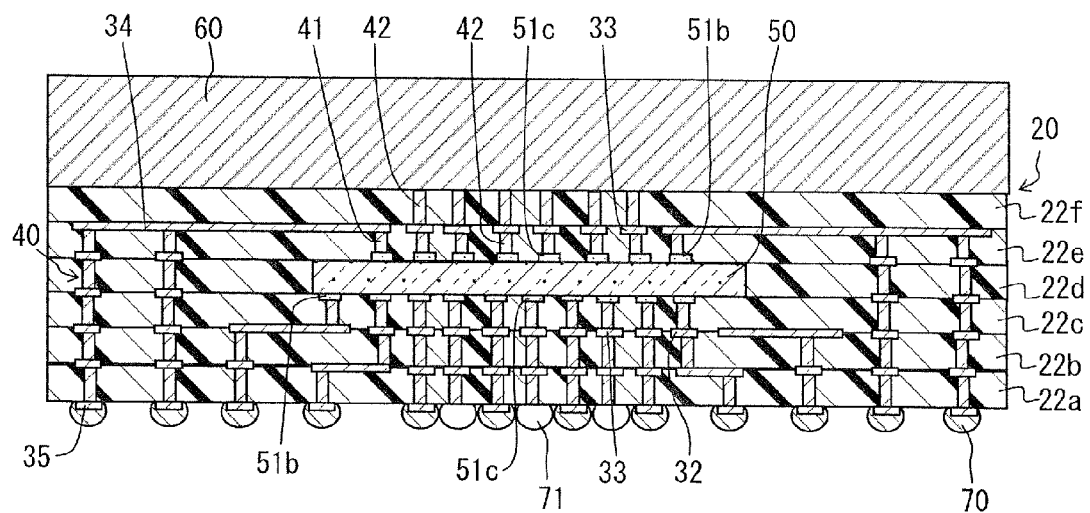
FIG. 17 is a diagram illustrating a circuit board according to a modification of the present embodiment.

The circuit board shown in FIG. 17 has no stud bump 52a. Even in the case of no stub bump, when the semiconductor chip 50 has the electrodes 51 on its both sides, local stress is applied through the electrodes 51 to the semiconductor chip 50 during the heat/pressure applying step.

According to the example shown in FIG. 17, the electrodes 51 on both sides of the semiconductor chip 50 are bonded to the conductive pastes by liquid-phase diffusion bonding in the heat/pressure applying step in order to reduce the local stress applied to the semiconductor chip 50. Thus, the semiconductor chip 50 is protected from damage so that reliability of the semiconductor chip 50 can be improved.

Differences between the example shown in FIG. 17 and the embodiments are as follows. The insulating member 20 is formed with six thermoplastic resin layers 22a-22f.

The conductive paste for providing the interlayer connection members 41, 42 is made of Sn particles having the average diameter of 3 μm, and Ag particles having the average diameter of from 5 μm to 10 μm. That is, the average diameter of Ag particles is from 1.6 to 3.3 times greater than the average diameter of Sn particles. A mixture ratio between Sn particles and Ag particles is 30:70 (wt %) The interlayer connection member 41 is electrically connected to the electrode 51b, and the interlayer connection member 42 is electrically connected to the dummy electrode 51c.

Figure 18:
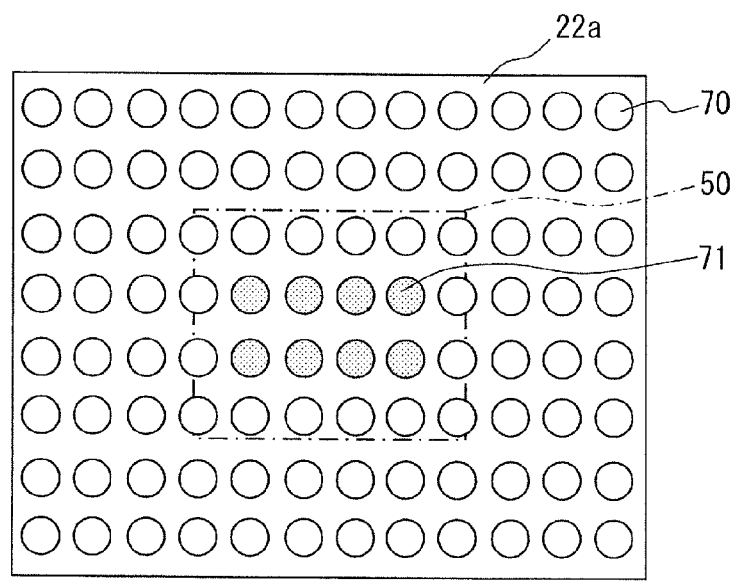
FIG. 18 is a diagram illustrating a bottom view of FIG. 17.

The circuit board shown in FIG. 17 includes the insulating member 20, the semiconductor chip 50 located in the insulating member 20, and the heat sink 60 located on one side of the insulating member 20. The insulating member 20 has the conductor pattern including the pads 32, 33, the lateral wiring member 34, and the external connection electrode 35. The insulating member 20 has the wiring member including the interlayer connection members 41, 42. The semiconductor chip 50 has the electrode 51b and the dummy electrode 51c on its both sides. The semiconductor chip 50 is encapsulated with the thermoplastic resin layers of the insulating member 20. The heat sink 60 is thermally connected to the semiconductor chip 50 through the dummy electrode 51c, the pad 33, and the interlayer connection member 42. Further, solder balls 70, 71 are formed on the other side of the insulating member 20. The solder ball 70 is connected to the external connection electrode 35. In contrast, the solder ball 71 is connected to the dummy electrode 51c so that heat in the semiconductor chip 50 can be transmitted to the solder ball 71 and released from the solder ball 71. As shown in FIG. 18, the solder ball 71 is located to face the semiconductor chip 50 in the thickness direction (i.e., stacked direction).

Figure 20:
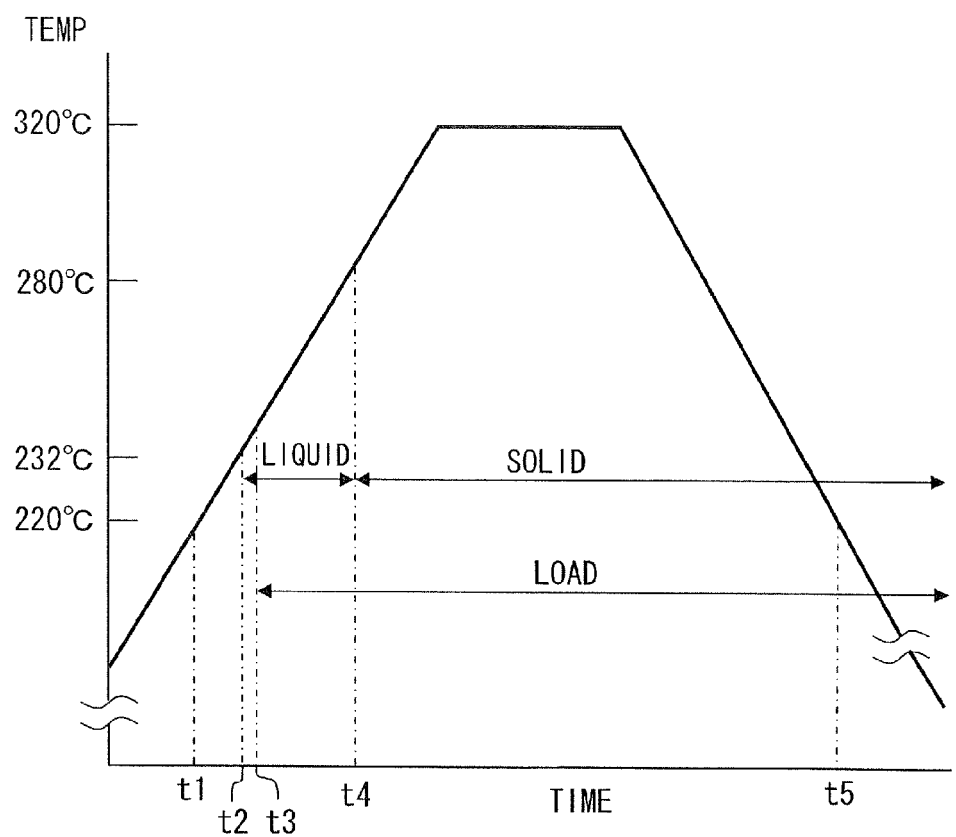
FIG. 20 is a diagram illustrating a change in a state of a conductive paste during a heat/pressure applying step according to the modification of the present embodiment.

A main feature of the example shown in FIG. 17 is the conductive paste. The main feature of the conductive paste is described below with reference to FIG. 20.

In the heat/pressure applying step, the heating temperature gradually increases. Then, when the heating temperature reaches about 220° C. at a time t1, the thermoplastic resin layers 22a-22f are softened.

Then, when the heating temperature reaches about 232° C. at a time t2, Sn particles are melted. Then, at a time t3 immediately after the time t2, application of pressure (i.e. load) to the stacked body is started. In the stacked body, the thermoplastic resin layers 22a-22f, the semiconductor chip 50, and the heat sink 60 are stacked in such a manner that the semiconductor chip 50 is located between the thermoplastic resin layers 22a-22f. Due to the application of heat and pressure reaction sintering between Sn particles and Ag particles in the conductive paste gradually progresses. Then, when the heating temperature reaches about 280° C. at a time t4 Sn particles and Ag particles are sintered and solidified. During a period from the time t3 to the time t4, some of Sn particles do not react yet and are in a liquid form (i.e., in a melted state) Therefore, during the period from the time t3 to the time t4, the conductive paste as a whole is in a creamy form and has a low viscosity. In other words, reaction sintering between Sn particles and Ag particles continues during the period from the time t3 to the time t4.

In this way, when the average diameter of Ag particles is from 1.6 to 3.3 times greater than the average diameter of Sn particles, reaction sintering between Sn particles and Ag particles continues during the period from the time t3 to the time t4. Since there are some Sn particles that do not react yet and are in a liquid form, the conductive paste as a whole is in a creamy form and has a low viscosity. Thus, the electrodes 51 on both sides of the semiconductor chip 50 are bonded to the conductive pastes by liquid-phase diffusion bonding in the heat/pressure applying step. Therefore, stress applied to the semiconductor chip 50 in the heat/pressure applying step can be reduced.

As mentioned above, when the heating temperature reaches about 280° C. at the time t4, Sn particles and Ag particles are sintered and solidified. It is noted that the thermoplastic resin layers 22a-22f become a liquid form after the time t4.

The electrodes 51b, 51c of the semiconductor chip 50 are bonded to the conductive paste (i.e., interlayer connection members 41, 42) during the period of from the time t2 to the time t4. That is, the metal diffusion layer (Ni—Sn alloy layer) is formed at the interface between the electrode 51b and the interlayer connection member 41 and at the interface between the electrode 51c and the interlayer connection member 42. Likewise, the conductor patterns 32-35 are bonded to the conductive pastes (i.e., interlayer connection members 41, 42) during the period of from the time t2 to the time t4.

Then, when the heating temperature reaches about 320° C., the heating temperature of 320° C. is kept for a predetermined period of time. Then, after a lapse of the predetermined period of time, the heating temperature is gradually reduced to a room temperature. The thermoplastic resin layers 22a-22f gradually become hardened during a period when the heating temperature decreases from about 320° C. to about 220° C. Then, when the heating temperature decreases to about 220° C. at a time t5, the thermoplastic resin layers 22a-22f are fully hardened. During the period when the thermoplastic resin layers 22a-22f gradually become hardened, the entire stacked body equally shrinks so that stress applied to the semiconductor chip 50 can be balanced.

The method of manufacturing the circuit board shown in FIG. 17 is described below with reference to FIGS. 19A-19C.

Firstly, a step of preparing the thermoplastic resin layers 22a-22f, the semiconductor chip 50, and the heat sink 60 is performed. It is noted that conductor patterns 32-34 are preformed on surfaces of the thermoplastic resin layers 22a-22f and that via holes filled with the conductive paste are preformed in the thermoplastic resin layers 22a-22f.

Figure 19A:
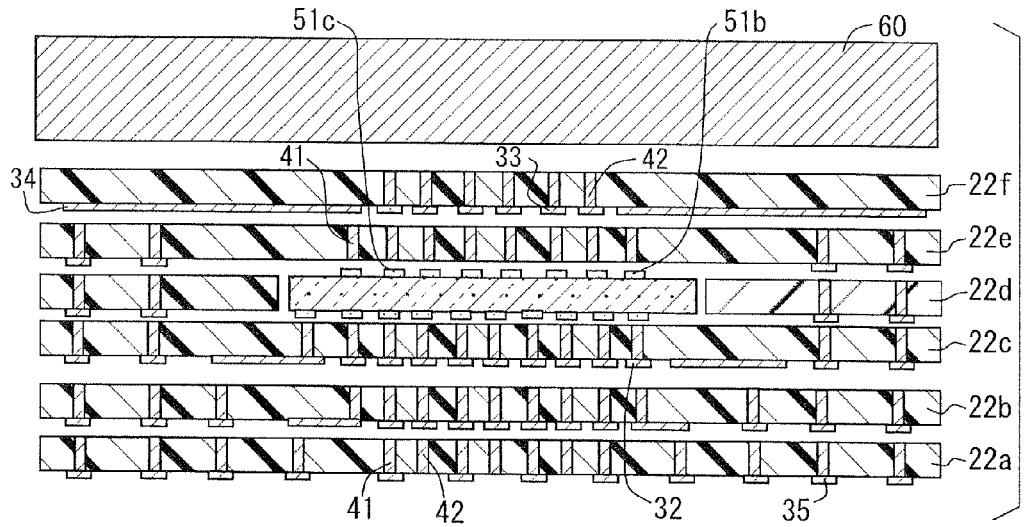
FIGS. 19A-19C are diagrams illustrating manufacturing steps according to the modification of the present embodiment.

Then as shown in FIG. 19A, the thermoplastic resin layers 22a-22f are stacked in this order while placing the semiconductor chip 50 in a through hole of the thermoplastic resin layers 22c. Further, the heat sink 60 is placed on the thermoplastic resin layers 22f. Thus, the stacked body is formed.

Next, a step of applying heat and pressure to the stacked body from its both sides in the stacked direction is performed using a vacuum thermal pressing machine. In this step, the thermoplastic resin layers 22a-22f are softened so that the stacked body can be joined together into a single insulating member 20 at a time. As a result, the semiconductor chip 50 is encapsulated in the insulating member 20, and the conductive particles in the conductive paste are sintered and joined to the conductor pattern 30 to form the wiring member.

In this step, in order to join together the resin layers of the stacked body into the insulating member 20 and in order to sinter the conductive particles in the conductive paste, heat greater than the glass-transition point and less than the melting point of the thermoplastic resin layer is continuously applied to the stacked body for a predetermined period of time, and pressure of about several MPa is continuously applied to the stacked body for the predetermined period of time. According to the example, heat of from about 280° C. to about 330° C. is continuously applied to the stacked body for five or more minutes (e.g., ten minutes), and pressure of from about several 4 MPa to about 5 MP is continuously applied to the stacked body for five or more minutes.

In the step of applying heat and pressure, the thermoplastic resin layers 22a-22f are softened under heat. Further, under pressure, the softened thermoplastic resin layers 22a-22f are in close contact with each other. Thus, the thermoplastic resin layers 22a-22f are joined together into the insulating member 20 at a time. Further, the softened thermoplastic resin layers 22f is in close contact with the heat sink 60 so that the insulating member 20 and the heat sink 60 can be joined together into a single circuit board.

The thermoplastic resin layers 22c-22e located adjacent to the semiconductor chip 50 move like a liquid under pressure and are in close contact with both sides of the semiconductor chip 50. Further, the thermoplastic resin layers 22c-22e move into a clearance between a side surface of the semiconductor chip 50 and the thermosetting resin layer 21d to fill the clearance. Thus, the thermoplastic resin layers 22c-22e are in close contact with the side surface of, the semiconductor chip 50. Therefore, the semiconductor chip 50 is sealed and encapsulated with the thermoplastic resin layers 22c-22e.

In the heat/pressure applying step, reaction sintering between Sn particles and Ag particles in the conductive paste gradually progresses. Finally, Sn particles and Ag particles are sintered and solidified. Thus the electrodes 51b, 51c are bonded to the conductive pastes (i.e., interlayer connection members 41, 42). Likewise the conductor patterns 32-35 are bonded to the conductive pastes (i.e., interlayer connection members 41, 42).

Figure 19B:
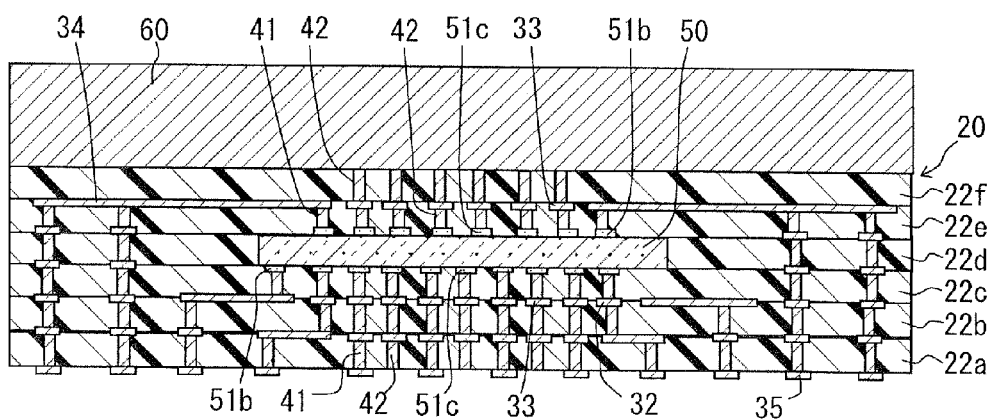
Figure 19C:
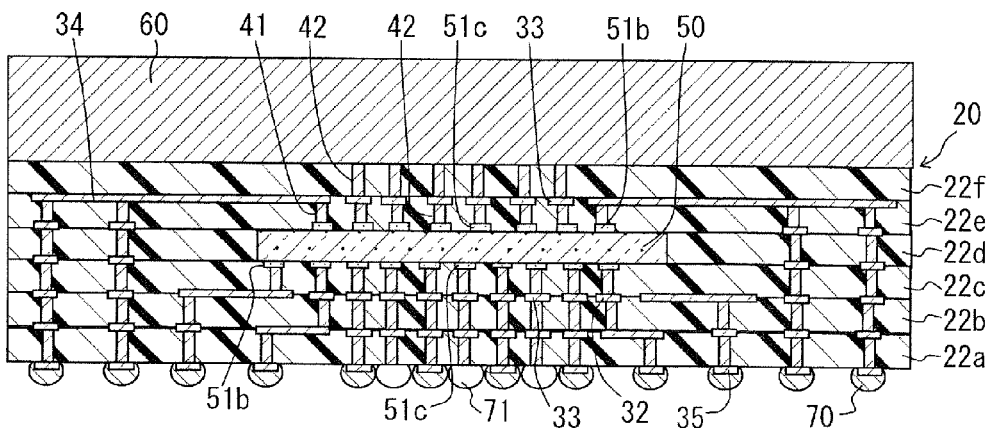

Thus, the structure shown in FIG. 19B can be obtained. Then, the solder balls 70, 71 are formed on the other side of the insulating member 20. Thus, the circuit board shown in FIG. 19C can be manufactured.

As described above, according to the example shown in FIG. 17, the electrodes 51 on both sides of the semiconductor chip 50 are bonded to the conductive pastes by, liquid-phase diffusion bonding in the heat/pressure applying step. In such an approach, the local stress applied to the semiconductor chip 50 is reduced so that reliability of the semiconductor chip 50 can be improved. Alternatively, the electrodes 51 on only one side of the semiconductor chip 50 can be bonded to the conductive pastes by liquid-phase diffusion bonding in the heat/pressure applying step. Even in such an approach, the local stress applied to the semiconductor chip 50 is reduced so that reliability of the semiconductor chip 50 can be improved.

That is, the example shown in FIG. 17 can be summarized as follows. The circuit board includes the insulating member and the semiconductor chip located in the insulating member and having the electrode on at least its one side. The method of manufacturing the circuit board includes the stacking step and the heat/pressure applying step In the stacking step, the stacked body is formed by stacking the resin layers in such a manner that the thermoplastic resin layers are at least alternately arranged and that both sides of the semiconductor chip are located adjacent to the thermoplastic resin layers. In the heat/pressure applying step, heat and pressure are applied to the stacked body from its both sides so that the thermoplastic resin layers of the stacked body can be softened. Thus all the resin layers of the stacked body can be joined together into the insulating member at a time. As a result, the semiconductor chip is encapsulated in the insulating member, and the conductive particles in the conductive paste are sintered and joined to the conductor pattern to form the wiring member. In the stacking step, the thermoplastic resin layer having the via hole field with the conductive paste is arranged in such a manner that the conductive paste faces the electrode of the semiconductor chip. In the heat/pressure applying step, the conductive paste of the thermoplastic resin layer is bonded to the electrode of the semiconductor chip by liquid phase diffusion so that the conductive particles in the conductive paste can be sintered.

Such changes and modifications are to be understood as being within the scope of the present invention as defined by the appended claims.

What is claimed is:

1. A circuit board comprising:
   an insulating member having a thermoplastic resin portion;
   a semiconductor chip having a first electrode on its first side and a second electrode on its second side opposite to the first side, the semiconductor chip being encapsulated with the thermoplastic resin portion; and
   a wiring member located in the insulating member and electrically connected to the first electrode and the second electrode, the wiring member including a conductor pattern with a pad, an interlayer connection member in a via hole, and a connection portion for connecting the pad and the first electrode, wherein
   a first diffusion layer is located at an interface between the first electrode and the connection portion,
   a second diffusion layer is located at an interface between the pad and the connection portion,
   a third diffusion layer is located at an interface between the second electrode and the interlayer connection member,
   at least one element of the interlayer connection member electrically connected to the second electrode has a melting point lower than a glass-transition point of the thermoplastic resin portion, and
   the connection portion is made of material having a melting point higher than a melting point of the thermoplastic resin portion.

2. The circuit board according to claim 1 wherein
   the insulating member includes a plurality of resin layers including a plurality of thermoplastic resin layers,
   the plurality of resin layers is stacked in such a manner that the plurality of thermoplastic resin layers is at least alternately arranged and that the semiconductor chip is sandwiched between adjacent thermoplastic resin layers from its both sides, and
   the plurality of resin layers is joined together into the insulating member by the plurality of thermoplastic resin layers as adhesive layers.

3. The circuit board according to claim 1, further comprising:
   a heat sink made of metal and located on the insulating member to face the second side of the semiconductor chip, wherein
   the heat sink is connected to the second electrode through the wiring member.

* * * * *